(12) United States Patent
Kim et al.

(10) Patent No.: US 10,554,228 B1
(45) Date of Patent: Feb. 4, 2020

(54) ERROR CORRECTION DEVICE AND ELECTRONIC DEVICE INCLUDING THE SAME

(71) Applicant: SK hynix Inc., Gyeonggi-do (KR)

(72) Inventors: Dae Sung Kim, Gyeonggi-do (KR); Myung Jin Jo, Gyeonggi-do (KR); Soon Young Kang, Gyeonggi-do (KR); Wan Je Sung, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/221,791

(22) Filed: Dec. 17, 2018

(30) Foreign Application Priority Data

Aug. 22, 2018 (KR) .................. 10-2018-0097884

(51) Int. Cl.
*H03M 13/00* (2006.01)
*H03M 13/37* (2006.01)
*H03M 13/11* (2006.01)

(52) U.S. Cl.
CPC ..... *H03M 13/612* (2013.01); *H03M 13/1171* (2013.01); *H03M 13/3723* (2013.01); *H03M 13/611* (2013.01)

(58) Field of Classification Search
CPC .......... H03M 13/1108; H03M 13/1111; H03M 13/612; H03M 13/1171; H03M 13/3723; H03M 13/611; H04L 25/067; H04L 1/0061
See application file for complete search history.

(56) References Cited

U.S. PATENT DOCUMENTS

| 2003/0138056 A1* | 7/2003 | Uesugi | H04L 1/005 375/262 |
| 2014/0258809 A1* | 9/2014 | Nguyen | H03M 13/1111 714/763 |

FOREIGN PATENT DOCUMENTS

| KR | 100842583 | 7/2008 |
| KR | 1020140098702 | 8/2014 |

* cited by examiner

*Primary Examiner* — Sung S Ahn
(74) *Attorney, Agent, or Firm* — IP & T Group LLP

(57) ABSTRACT

An error correction device includes: a plurality of variable node units each configured to: receive a hard decision bit and a channel reliability value having a first bit-precision; and perform an iteration of a decoding operation on the hard decision bit based on the channel reliability value; a plurality of check node units each configured to: receive one or more reference reliability values having a second bit-precision from one or more variable node units coupled thereto among the plurality of variable node units during the iteration; and transmit, based on the one or more reference reliability values, one or more check reliability values having the second bit-precision to the one or more variable node units coupled thereto, wherein, during the iteration, each of the plurality of variable node units further: receives one or more first check reliability values from one or more check node units coupled thereto among the plurality of check node units; and updates the hard decision bit with reference to the channel reliability value and the one or more first check reliability values by upsizing the first bit-precision of the channel reliability value and the second bit-precision of the one or more first check reliability values.

20 Claims, 20 Drawing Sheets

FIG.5

| CNVTB | | | | | | | | |
|---|---|---|---|---|---|---|---|---|
| HD | 1 | | | | 0 | | | |
| SD | SD1 | SD2 | SD3 | SD4 | SD5 | SD6 | SD7 | SD8 |
| CNV | -3 | -2 | -1 | -0 | +0 | +1 | +2 | +3 |

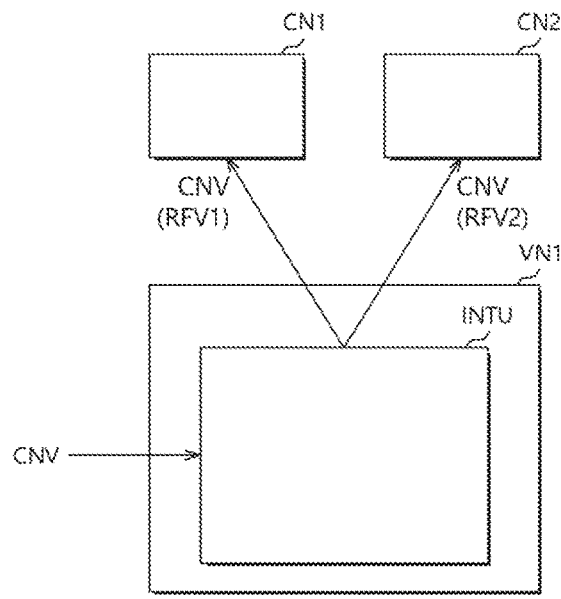
FIG.6A
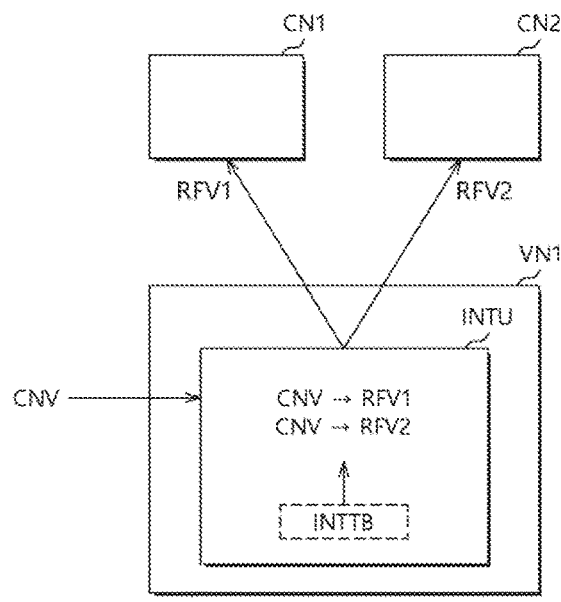
FIG.6B
FIG.6C
| INTTB | | | | | | | |
|---|---|---|---|---|---|---|---|
| IN | -3 | -2 | -1 | -0 | +0 | +1 | +2 | +3 |
| OUT | -3 | -2 | -1 | -0 | +0 | +1 | +2 | +3 |

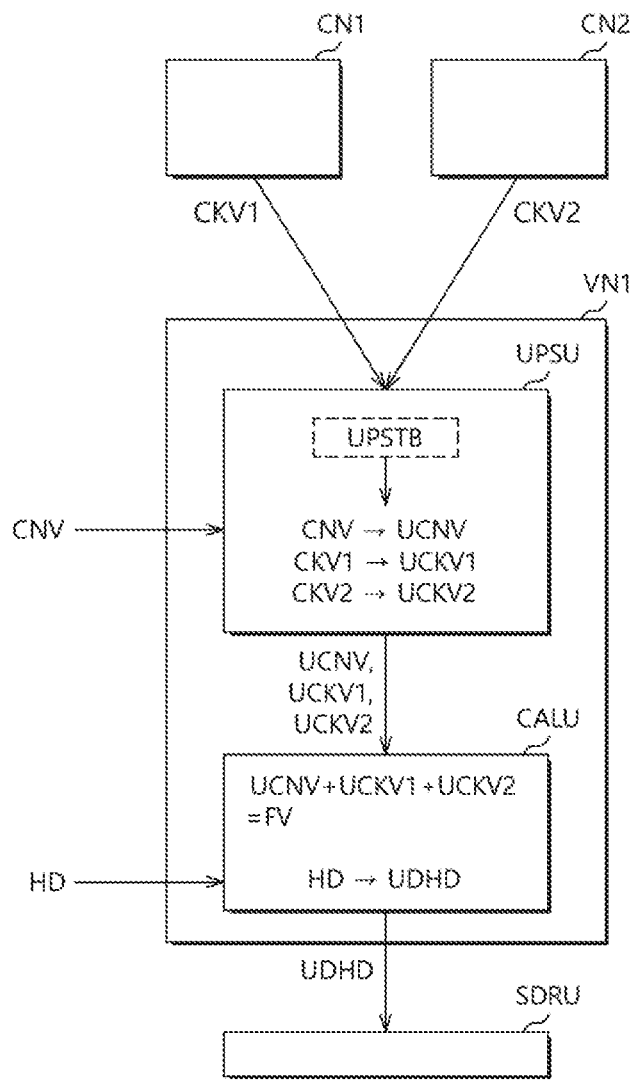

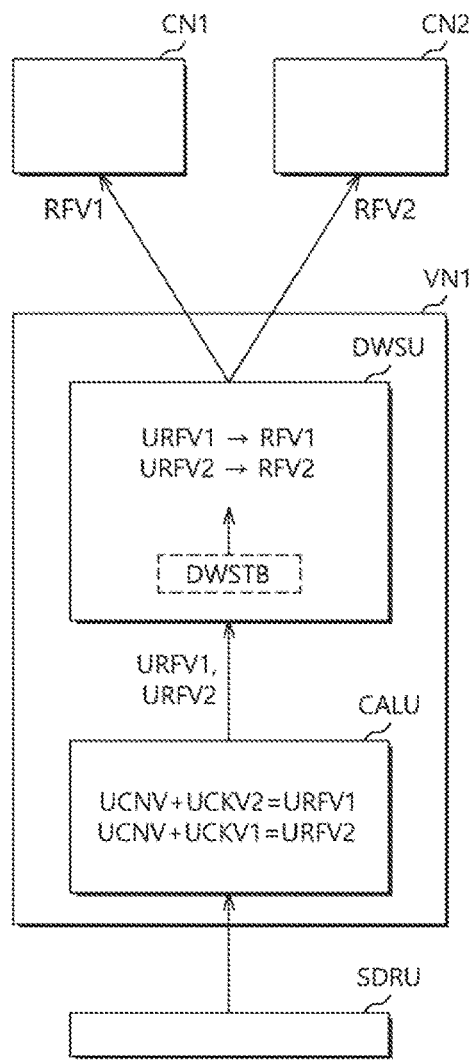

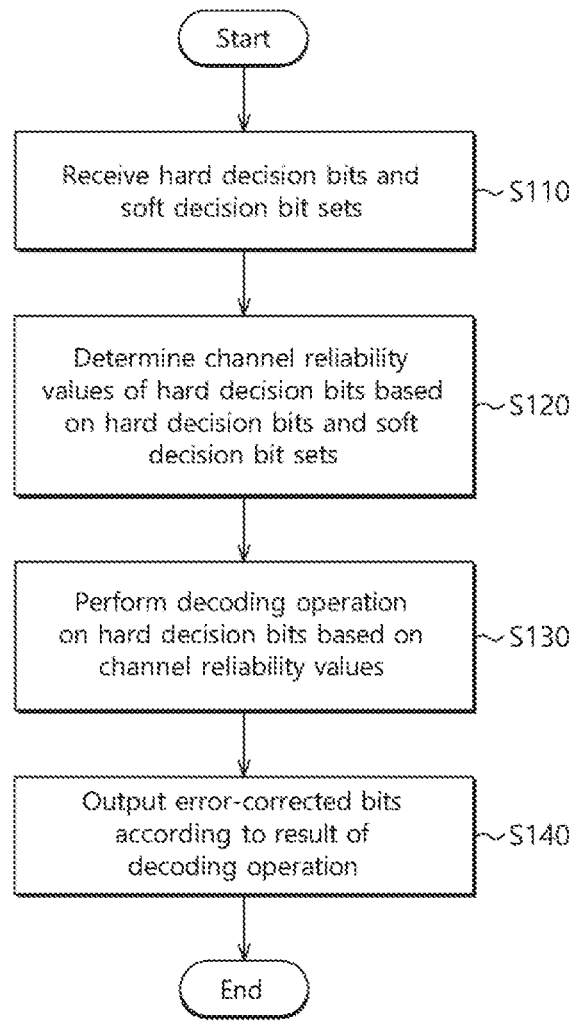

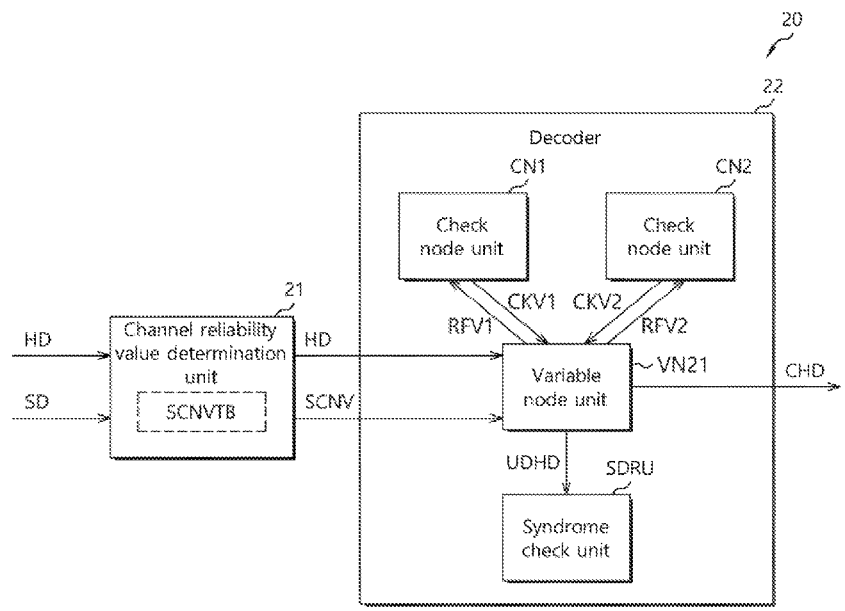

ERROR CORRECTION DEVICE AND ELECTRONIC DEVICE INCLUDING THE SAME

CROSS-REFERENCES TO RELATED APPLICATION

The present application claims priority under 35 U.S.C. § 119(a) to Korean application number 10-2018-0097884, filed on Aug. 22, 2018, in the Korean Intellectual Property Office, which is incorporated herein by reference in its entirety.

BACKGROUND

1. Technical Field

Various embodiments generally relate to an error correction device, and more particularly, to an error correction device which is operated with predetermined bit-precision.

2. Related Art

An error correction device may be applied to various electronic systems, such as a communication system and a data storage system, for processing data, and used to correct an error generated in the data.

The error correction device may receive data to be error-corrected and reliability data indicating the reliability of the data, and correct an error of the data based on the reliability data.

The error correction device may be operated under limitation of predetermined bit-precision, which may limit transmission capability or calculation capability between internal calculation nodes. The limitation of the bit-precision may preclude accurate reliability information from being reflected to a decoding operation, and consequently reduce the error correction performance. As the bit-precision of the error correction device is increased, the error correction performance may be generally enhanced. However, expansion of the bit-precision may be accompanied with hardware complexity and an increase in power consumption.

SUMMARY

In an embodiment, an error correction device may include: a plurality of variable node units each configured to: receive a hard decision bit and a channel reliability value having a first bit-precision; and perform an iteration of a decoding operation on the hard decision bit based on the channel reliability value; a plurality of check node units each configured to: receive one or more reference reliability values having a second bit-precision from one or more variable node units coupled thereto among the plurality of variable node units during the iteration; and transmit, based on the one or more reference reliability values, one or more check reliability values having the second bit-precision to the one or more variable node units coupled thereto, wherein, during the iteration, each of the plurality of variable node units further: receives one or more first check reliability values from one or more check node units coupled thereto among the plurality of check node units; and updates the hard decision bit with reference to the channel reliability value and the one or more first check reliability values by upsizing the first bit-precision of the channel reliability value and the second bit-precision of the one or more first check reliability values.

In an embodiment, the output values included in the downsizing table may be identical with input values included in the upsizing table.

In an embodiment, each of the variable node units may perform an initial iteration of the decoding operation by determining the channel reliability value to be a first reference reliability value and transmitting the first reference reliability value to each of the check node units coupled thereto.

In an embodiment, an electronic device may include: a memory device including a plurality of memory cells and configured to: read respective hard decision bits from the plurality of memory cells by applying a hard read voltage to the plurality of memory cells; and read respective soft decision bit sets from the plurality of memory cells by applying a plurality of soft read voltages to the plurality of memory cells, wherein the soft read voltages are generated by adding or subtracting predetermined offset values to or from the hard read voltage, and each of the soft decision bit sets includes information about a difference between a threshold voltage of a corresponding memory cell and the hard read voltage; a channel reliability value determination unit configured to determine channel reliability values having first bit-precision based on the soft decision bit sets; and a decoder configured to receive the hard decision bits and the channel reliability values, and perform a decoding operation on the hard decision bits based on the channel reliability values, wherein the decoder comprises: a plurality of variable node units each configured to: receive a corresponding hard decision bit of the hard decision bits and a corresponding channel reliability value of the channel reliability values; and perform an iteration of the decoding operation on the corresponding hard decision bit based on the corresponding channel reliability value; and a plurality of check node units each configured during the iteration to: receive one or more reference reliability values having second bit-precision respectively from one or more variable node units coupled thereto among the plurality of variable node units; and transmit, based on the one or more reference reliability values, one or more check reliability values having the second bit-precision to the one or more variable node units coupled thereto, wherein, during the iteration, each of the plurality of variable node units further: receives one or more first check reliability values respectively from one or more check node units coupled thereto among the plurality of check node units; and updates the hard decision bit with reference to the channel reliability value and the one or more first check reliability values by upsizing the first bit-precision of the channel reliability value and the second bit-precision of the one or more first check reliability values.

In an embodiment, a decoding method with an iterative error correction code represented by a bipartite graph comprising variable nodes and check nodes, which are interconnected according to a check matrix defined by the iterative error correction code may include: generating one or more variable messages including a log-likelihood ratio (LLR) of a hard decision bit; updating the hard decision bit based on a reliability value of the hard decision bit generated on the basis of the LLR and one or more check messages, which are generated on the basis of the variable messages, through upsize of bit-resolution of the LLR and the check messages; updating the variable messages based on the LLR and the check messages of the upsized bit-resolution by recovering bit-resolution of the variable messages; and performing an iteration of the updating the hard decision bit and the updating the variable messages until the updated hard decision bit is determined as correct through the check matrix.

BRIEF DESCRIPTION OF THE DRAWINGS

FIG. 5 is a diagram illustrating a channel reliability value table to which a channel reliability value determination unit of FIG. 3 refers, in accordance with an embodiment.

FIGS. 6A to 6C are diagrams illustrating a method of starting, by an initial processing unit of the variable node unit of FIG. 4, an initial iteration of a decoding operation in accordance with an embodiment.

FIGS. 7A and 7B are diagrams illustrating a method of performing, by the variable node unit of FIG. 4, the decoding operation in accordance with an embodiment.

FIGS. 8A to 8C are diagrams illustrating a method of performing, by the variable node unit of FIG. 4, the decoding operation in accordance with an embodiment.

FIG. 9 is a flowchart illustrating a method of operating the error correction device of FIG. 1 in accordance with an embodiment.

FIG. 14A is a block diagram illustrating an error correction device 20 in accordance with an embodiment.

FIG. 14B is a diagram illustrating a channel reliability value table to which a channel reliability value determination unit of FIG. 14A refers, in accordance with an embodiment.

DETAILED DESCRIPTION

Figure 1:
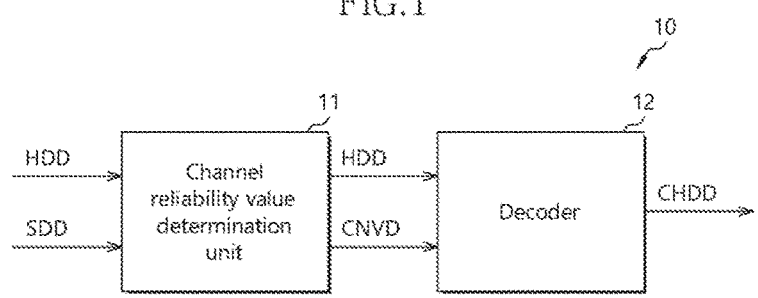
FIG. 1 is a block diagram schematically illustrating an error correction device in accordance with an embodiment.

Advantages and features of the present disclosure, and implementation methods thereof will be described through following embodiments described with reference to the accompanying drawings. The present disclosure may, however, be embodied in different forms and should not be construed as limited to the embodiments set forth herein. The present embodiments are only provided to describe the present disclosure in detail, such that the technical idea of the present disclosure can be easily carried out by those skilled in the art to which the present disclosure pertains.

In the drawings, the exemplary embodiments of the present disclosure are not limited to the illustrated specific forms, but may be exaggerated for the purpose of clarity. Specific terms have been used in the present specification. However, the terms are used in order to describe the present disclosure and are not used in order to limit the meaning or the scope of the present disclosure, which is disclosed in the appended claims. In the specification, an expression such as "and/or" means at least one of components listed before/after the expression. It will be understood that when an element is referred to as being "connected" or "coupled" to another element, it can be directly connected or coupled to the other element or intervening elements may be present. The terms of a singular form may include plural forms unless specifically mentioned. It will be further understood that the terms "comprises or includes" and/or "comprising or including" used in this specification, specify the presence of stated components, steps, operations, and elements, but do not preclude the presence or addition of one or more other components, steps, operations, and elements.

Hereinafter, embodiments will be described in detail with reference to the accompanying drawings.

FIG. 1 is a block diagram schematically illustrating an error correction device 10 in accordance with an embodiment.

Referring to FIG. 1, the error correction device 10 may correct error bits included in hard decision bits HDD to output error-corrected bits CHDD. The error correction device 10 may also receive soft decision bit sets SDD corresponding to the respective hard decision bits HDD and refer to the soft decision bit sets SDD to correct the error bits included in the hard decision bits HDD. For example, a single hard decision bit HD may correspond to a single soft decision bit set SD as described later with reference to FIG. 3. Each soft decision bit set SD may indicate the degree of reliability of the corresponding hard decision bit HD. Each soft decision bit set SD may be formed of one or more soft decision bits, as described later with reference to FIG. 3.

In detail, the error correction device 10 may include a channel reliability value determination unit 11 and a decoder 12.

Figure 3:
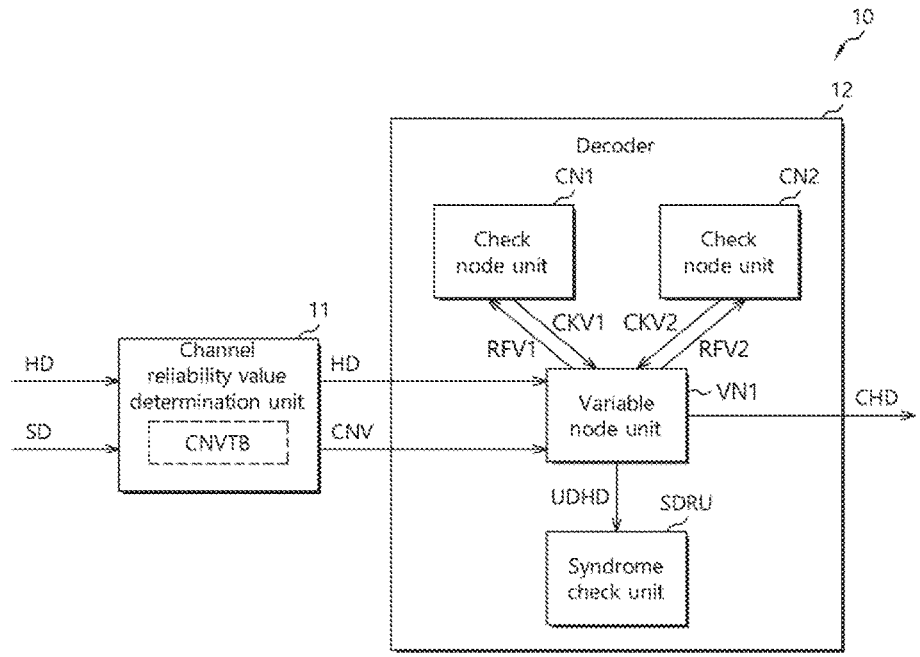
FIG. 3 is a block diagram illustrating in more detail the error correction device of FIG. 1 in accordance with an embodiment.

The channel reliability value determination unit 11 may receive hard decision bits HDD and soft decision bit sets SDD from the outside of the error correction device 10. The channel reliability value determination unit 11 may determine channel reliability values CNVD of the hard decision bits HDD based on the hard decision bits HDD and the soft decision bit sets SDD, and transmit the determined channel reliability values CNVD to the decoder 12. Since each channel reliability value CNV of FIG. 3 is generated based on the corresponding soft decision bit set SD, the channel reliability value CNV may indicate the degree of reliability of the corresponding hard decision bit HD. However, as will be described below, the channel reliability values CNVD may be determined to have predetermined bit-precision according to processing capabilities of internal units of the decoder 12.

The decoder 12 may receive the hard decision bits HDD and the channel reliability values CNVD from the channel reliability value determination unit 11, and perform a decoding operation on the hard decision bits HDD based on the channel reliability values CNVD. If the decoding operation has succeeded, the decoder 12 may output error-corrected bits CHDD. Although not illustrated, if the decoding operation has failed, the decoder 12 may output, for example, a decoding failure report.

Although FIG. 1 illustrates that the decoder 12 receives the hard decision bits HDD from the channel reliability value determination unit 11 as an exemplary embodiment, the decoder 12 may directly receive the hard decision bits HDD from the outside of the error correction device 10 without passing through the channel reliability value determination unit 11, in some embodiments.

The decoder 12 may perform a decoding operation, for example, based on a binary low density parity check (LDPC) code, a non-binary LDPC code, or a turbo product code. However, embodiments of the present disclosure are not limited thereto.

As will be described in detail below, although the bit-precision of the channel reliability values CNVD is limited depending on the processing capabilities of the internal units of the decoder 12, the decoder 12 may temporarily upsize bit-precision of the channel reliability values CNVD and perform the decoding operation based on the upsized bit-precision of the channel reliability values CNVD. If the bit-precision is upsized, the channel reliability values CNVD may more accurately reflect probabilistic characteristics of the hard decision bits HDD. Hence, the performance of the decoding operation of the decoder 12 may be enhanced.

Figure 2:
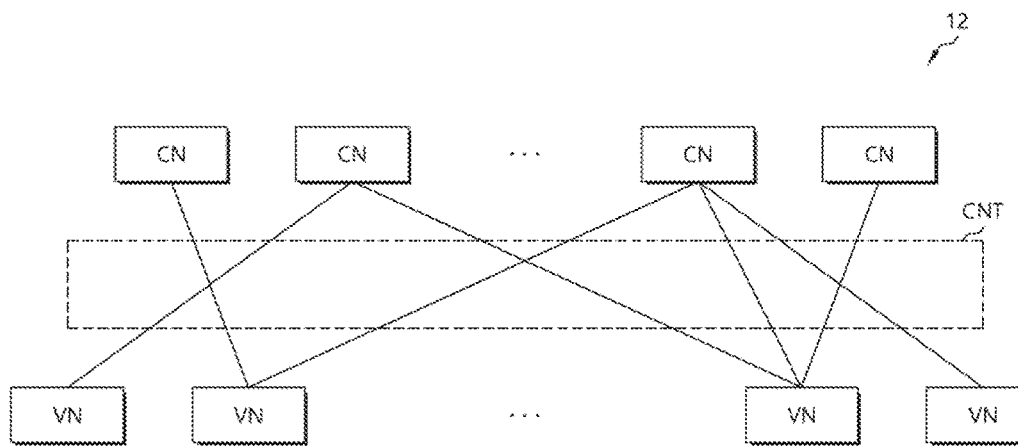
FIG. 2 is a block diagram illustrating variable node units and check node units included in a decoder in accordance with an embodiment.

FIG. 2 is a block diagram illustrating variable node units VN and check node units CN that are included in the decoder 12 in accordance with an embodiment.

Referring to FIG. 2, the decoder 12 may include the plurality of variable node units VN and the plurality of check node units CN.

The check node units CN and the variable node units VN may be coupled by a connector CNT according to an error correction algorithm or a parity check matrix which is applied to the decoder 12. Each of the variable node units VN may be coupled with one or more check node units CN based on the error correction algorithm or the parity check matrix that is applied to the decoder 12. The connector CNT may include all connections between the variable node units VN and the check node units CN of the decoder 12.

The variable node units VN may respectively receive and process the hard decision bits HDD of FIG. 1 that are inputted to the decoder 12, and may output error-corrected bits CHDD. In detail, each of the variable node units VN may receive a corresponding hard decision bit HD among the hard decision bits HDD inputted to the decoder 12. Each of the variable node units VN may correct the hard decision bit HD by exchanging a reliability value of the hard decision bit HD with check node units CN coupled thereto, and output error-corrected bit CHD of FIG. 3.

FIG. 3 is a block diagram illustrating in more detail the error correction device 10 of FIG. 1 in accordance with an embodiment. For the sake of simplification of explanation, FIG. 3 illustrates in detail configurations of the error correction device 10 which are operated with respect to one hard decision bit HD. The hard decision bit HD may be one of a plurality of hard decision bits HDD which are inputted to the error correction device 10. The error correction device 10 may process each of the plurality of hard decision bits HDD in the same manner as a method of processing the hard decision bit HD in FIG. 3. For example, the error correction device 10 may simultaneously process the plurality of hard decision bits HDD according to the method of processing the hard decision bit HD in FIG. 3.

Referring to FIG. 3, the error correction device 10 may include the channel reliability value determination unit 11 and the decoder 12 of FIG. 1.

The channel reliability value determination unit 11 may receive a hard decision bit HD and a corresponding soft decision bit set SD among the soft decision bit sets SDD (refer to FIG. 1) from the outside of the error correction device 10. The soft decision bit set SD may indicate the degree of reliability of the hard decision bit HD. The soft decision bit set SDD may be formed of one or more soft decision bits.

The channel reliability value determination unit 11 may determine a channel reliability value CNV of the hard decision bit HD based on the soft decision bit set SD, and transmit the hard decision bit HD and the channel reliability value CNV to the decoder 12. The channel reliability value CNV may be a value corresponding to the hard decision bit HD among the channel reliability values CNVD described with reference to FIG. 1. The channel reliability value determination unit 11 may determine, with reference to a channel reliability value table CNVTB, the channel reliability value CNV mapped to the soft decision bit set SD.

The channel reliability value table CNVTB may include the channel reliability value CNV as an output value corresponding to a value of the soft decision bit set SD as an input value. The channel reliability value table CNVTB may include a plurality of possible values of the soft decision bit set SD each mapped to a corresponding channel reliability value CNV. Therefore, the channel reliability value determination unit 11 may determine the channel reliability value CNV corresponding to the input value of the soft decision bit set SD based on the channel reliability value table CNVTB.

The channel reliability value CNV included in the channel reliability value table CNVTB may have predetermined bit-precision, as described above. Operating methods of the channel reliability value table CNVTB and the channel reliability value determination unit 11 will be described in detail with reference to FIG. 5.

The decoder 12 may receive the hard decision bit HD and the channel reliability value CNV, and output an error-corrected bit CHD by performing a decoding operation on the hard decision bit HD based on the channel reliability value CNV. If the hard decision bit HD is an error bit, the decoder 12 may flip the hard decision bit HD and output the flipped hard decision bit HD as an error-corrected bit CHD. If the hard decision bit HD is not an error bit, the decoder 12 may output the hard decision bit HD as an error-corrected bit CHD.

Although FIG. 3 illustrates that the decoder 12 receives the hard decision bit HD from the channel reliability value determination unit 11 as an exemplary embodiment, the decoder 12 may directly receive the hard decision bit HD from the outside of the error correction device 10 without passing through the channel reliability value determination unit 11, in some embodiments.

The decoder 12 may include a variable node unit VN1, check node units CN1 and CN2, and a syndrome check unit SDRU. The check node units CN1 and CN2 and the syndrome check unit SDRU may be coupled to the variable node unit VN1. FIG. 3 illustrates as an example that the variable node unit VN1 is coupled with the two check node units CN1 and CN2. In some embodiments, the variable node unit VN1 may be coupled with one or more check node units based on the error correction algorithm or the parity check matrix that is applied to the decoder 12.

The variable node unit VN1 may receive the hard decision bit HD and the channel reliability value CNV, and output an error-corrected bit CHD by performing a decoding operation.

The variable node unit VN1 may perform one or more iterations in the decoding operation. Each iteration may include the step of updating the hard decision bit HD based on the channel reliability value CNV and reference reliability values RFV1 and RFV2 and check reliability values CKV1 and CKV2, which are exchanged between the variable node unit VN1 and the check node units CN1 and CN2, and the step of determining whether the decoding operation has succeeded on an updated hard decision bit UDHD by transmitting the updated hard decision bit UDHD to the syndrome check unit SDRU.

If the decoding operation has succeeded, the variable node unit VN1 may output the updated hard decision bit UDHD as the error-corrected bit CHD and terminate the decoding operation without performing any more iteration. On the other hand, if the decoding operation has failed, the variable node unit VN1 may perform a new iteration. The variable node unit VN1 may perform the iteration up to a predetermined maximum count of iterations until the decoding operation succeeds. If the decoding operation has failed even though the iteration has been repeated up to the predetermined maximum count of iterations, the variable node unit VN1 may terminate the decoding operation and output a decoding failure report.

During each iteration, the variable node unit VN1 may update the hard decision bit HD through a predetermined calculation operation while exchanging the reference reliability values RFV1 and RFV2 and the check reliability values CKV1 and CKV2 with the check node units CN1 and CN2. The reference reliability values RFV1 and RFV2 and the check reliability values CKV1 and CKV2 may be determined to have bit-precision depending on the processing capabilities of the check node units CN1 and CN2. However, the variable node unit VN1 may temporarily upsize bit-precision of the check reliability values CKV1 and CKV2 and perform the decoding operation based on the upsized bit-precision of the check reliability values CKV1 and CKV2. The configuration of the variable node unit VN1 and an operating method thereof will be described in detail with reference to FIG. 4.

During each iteration, the check node units CN1 and CN2 may respectively receive the reference reliability values RFV1 and RFV2 from the variable node unit VN1, and respectively transmit the check reliability values CKV1 and CKV2 to the variable node unit VN1. Although not illustrated, during each iteration, each of the check node units CN1 and CN2 may further receive reference reliability values from one or more variable node units coupled thereto, including the variable node unit VN1, In this case, each of the check node units CN1 and CN2 may determine a check reliability value based on the received reference reliability values, and transmit the determined check reliability value to the variable node unit VN1. More specifically, each of the check node units CN1 and CN2 may determine a check reliability value corresponding to each of the one or more variable node units based on the received reference reliability values, and transmit the determined check reliability value to a corresponding variable node unit among the one or more variable node units. In detail, each of the check node units CN1 and CN2 may determine, based on the received reference reliability values, a check reliability value as a new reliability value of the hard decision bit HD.

For example, in the case where the decoder 12 is operated according to a min-sum algorithm, each of the check node units CN1 and CN2 may determine a check reliability value for the variable node unit VN1 by determining, as the magnitude of the check reliability value, a minimum value of the received reference reliability values except for the reference reliability value transmitted from the variable node unit VN1, and determining the sign of the check reliability value such that a binary sum of hard decision bits of the variable node units coupled thereto is '0'. The operating method of the check node unit may comply with the conventional art, Therefore, detailed explanation thereof will be omitted.

During each iteration, the syndrome check unit SDRU may receive an updated hard decision bit UDHD from the variable node unit VN1. In addition, during each iteration, the syndrome check unit SDRU may receive respective updated hard decision bits from a plurality of variable node units included in the decoder 12. The syndrome check unit SDRU may calculate a syndrome vector by performing a syndrome check operation on the updated hard decision bits based on the error correction algorithm or the parity check matrix that is applied to the decoder 12. The syndrome check unit SDRU may determine that the decoding operation has succeeded when the syndrome vector includes only '0'. The syndrome check unit SDRU may determine that the decoding operation has failed when the syndrome vector includes at least one '1'. The syndrome check unit SDRU may transmit the result of the decoding operation to the variable node unit VN1. An operating method of the syndrome check unit SDRU may comply with the conventional art. Therefore, detailed explanation thereof will be omitted.

Figure 4:
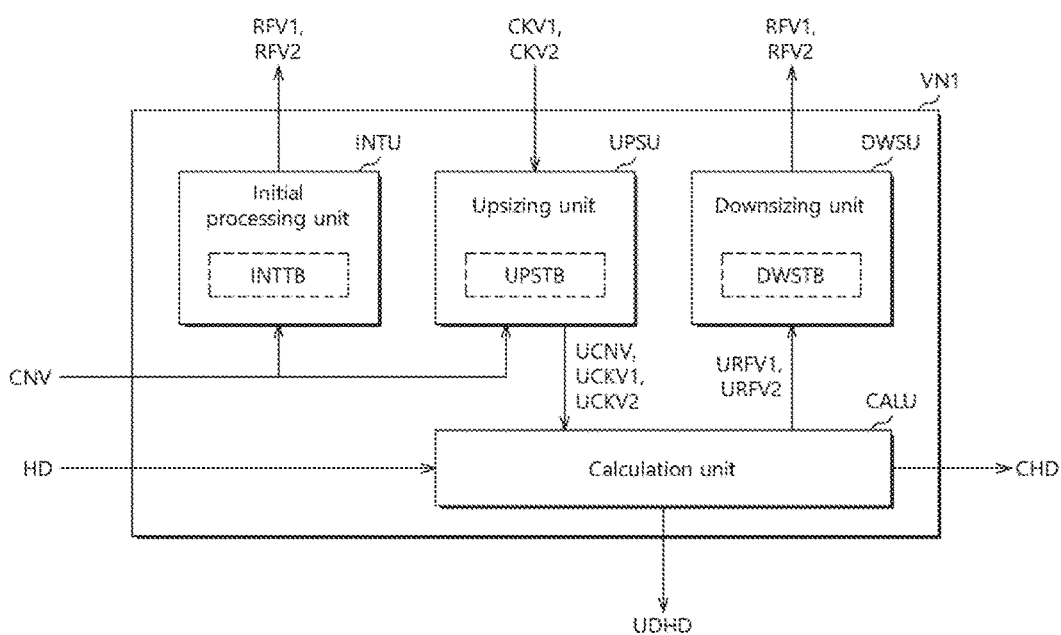
FIG. 4 is a block diagram illustrating in detail a variable node unit of FIG. 3 in accordance with an embodiment.

FIG. 4 is a block diagram illustrating in detail the variable node unit VN1 of FIG. 3 in accordance with an embodiment.

Referring to FIG. 4, the variable node unit VN1 may include an initial processing unit INTU, an upsizing unit UPSU, a calculation unit CALU, and a downsizing unit DWSU.

The initial processing unit INTU may receive the channel reliability value CNV from the channel reliability value determination unit 11 of FIG. 3, and start an initial iteration of the decoding operation. During the initial iteration, the initial processing unit INTU may determine reference reliability values RFV1 and RFV2 based on the channel reliability value CNV, and transmit the determined reference reliability values RFV1 and RFV2, respectively, to the check node units CN1 and CN2 of FIG.

In an embodiment, the initial processing unit INTU may determine the channel reliability value CNV as the reference reliability values RFV1 and RFV2. In an embodiment, the initial processing unit INTU may determine the reference reliability values RFV1 and RFV2 with reference to an initial table INTTB. An operating method of the initial processing unit INTU will be described in detail with reference to FIGS. 6A and 6B.

The upsizing unit UPSU may receive check reliability values CKV1 and CKV2 from the check node units CN1 and CN2 during the initial iteration and/or each subsequent iteration. The upsizing unit UPSU may determine, based on an upsizing table UPSTB, an upsized channel reliability value UCNV mapped to the channel reliability value CNV, and upsized check reliability values UCKV1 and UCKV2 mapped to the check reliability values CKV1 and CKV2, and may transmit them to the calculation unit CALU. The upsizing unit UPSU may upsize the bit-precision of the channel reliability value CNV and the bit-precision of the check reliability values CKV1 and CKV2, based on the upsizing table UPSTB.

The upsizing unit UPSU may receive and store the channel reliability value CNV when the initial iteration is performed, and then use the stored channel reliability value CNV during each subsequent iteration. An operating method of the upsizing unit UPSU will be described in detail with reference to FIG. 7.

During the initial iteration and/or each subsequent iteration, the calculation unit CALU may update the hard decision bit HD based on the upsized channel reliability value UCNV and the upsized check reliability values UCKV1 and UCKV2, and transmit the updated hard decision bit UDHD to the syndrome check unit SDRU of FIG. 3. If the calculation unit CALU receives, from the syndrome check unit SDRU, the report that the decoding operation has succeeded, the calculation unit CALU may output the updated hard decision bit UDHD as an error-corrected bit CHD and terminate the decoding operation. This operating method of the calculation unit CALU will be described in detail with reference to FIG. 7.

On the other hand, if the calculation unit CALU receives, from the syndrome check unit SDRU, the report that the decoding operation has failed, the calculation unit CALU may compare the current count of iterations with the maximum count of iterations and start a subsequent iteration. During the subsequent iteration, the calculation unit CALU may determine upsized reference reliability values URFV1 and URFV2 respectively corresponding to the check node units CN1 and CN2, based on the upsized channel reliability value UCNV and the upsized check reliability values UCKV1 and UCKV2 that have been determined during the preceding iteration, and transmit the determined upsized reference reliability values URFV1 and URFV2 to the downsizing unit DWSU. This operating method of the calculation unit CALU will be described in detail with reference to FIGS. 8A and 8B.

The downsizing unit DWSU may receive upsized reference reliability values URFV1 and URFV2 respectively corresponding to the check node units CN1 and CN2 from the calculation unit CALU during each subsequent iteration other than the initial iteration. The downsizing unit DWSU may determine reference reliability values RFV1 and RFV2 mapped to the upsized reference reliability values URFV1 and URFV2, based on a downsizing table DWSTB, and transmit the determined reference reliability values RFV1 and RFV2 to the check node units CN1 and CN2. In other words, the downsizing unit DWSU may downsize the bit-precision of the upsized reference reliability values URFV1 and URFV2 based on the downsizing table DWSTB. An operating method of the downsizing unit DWSU will be described in detail with reference to FIGS. 8A and 8B.

The channel reliability value table CNVTB of FIG. 3, and the initial table INTTB, the upsizing table UPSTB, and the downsizing table DWSTB of FIG. 4 may be provided from the outside of the error correction device 10 and stored in an internal memory of the error correction device 10, or may be stored in internal nonvolatile table memories of the error correction device 10 and used by being read from the nonvolatile table memories.

FIG. 5 is a diagram illustrating the channel reliability value table CNVTB to which the channel reliability value determination unit 11 of FIG. 3 refers, in accordance with an embodiment. Hereinafter, the configuration of the channel reliability value table CNVTB and a method of determining, by the channel reliability value determination unit 11, a channel reliability value CNV with reference to the channel reliability value table CNVTB will be described with reference to FIG. 5.

Referring to FIG. 5, the channel reliability value table CNVTB may include the channel reliability value CNV as an output value corresponding to a value of the soft decision bit set SD as an input value. The soft decision bit set SD may correspond to the hard decision bit HD. The channel reliability value table CNVTB may include a plurality of possible values SD1 to SD8 of the soft decision bit set SD each mapped to a corresponding channel reliability value CNV.

The input values SD1 to SD8 of the soft decision bit set SD may be all values which may be inputted to the channel reliability value determination unit 11 as the soft decision bit set SD.

The channel reliability value CNV may be determined as an output value depending on the value of the soft decision bit set SD. The channel reliability value CNV may have a magnitude ranging from 0 to 3 and a sign of '−' or '+'. The magnitude of the channel reliability value CNV may indicate the reliability of the hard decision bit HD, and the sign thereof may indicate whether the hard decision bit HD is 1 or 0.

Therefore, the channel reliability value determination unit 11 may determine an output value or the channel reliability value CNV of the hard decision bit HD mapped to the input value (i.e., one of the values SD1 to SD8) of the soft decision bit set SD in the channel reliability value table CNVTB. For example, when the hard decision bit HD is 1 and the soft decision bit set SD has the input value SD3, the channel reliability value determination unit 11 may determine the output value or the channel reliability value CNV of −1 mapped to the input value SD3 according to the channel reliability value table CNVTB.

The channel reliability value CNV included in the channel reliability value table CNVTB may be estimated values of a log-likelihood ratio (hereinafter, referred to as "LLR") of the following [Equation 1]. In [Equation 1], x may denote a value inputted to the channel, and y may denote a value received from the channel to the decoder 12. In other words, y may indicate the hard decision bit HD, and x may indicate a correct value (i.e., the error-corrected bit CHD) of the hard decision bit HD.

$$LLR=\log(P(y|x=0)/P(y|x=1)). \qquad \text{[Equation 1]}$$

It is difficult to calculate a practical LLR according to [Equation 1], and if the practical LLR is inputted to the decoder 12 as the channel reliability value CNV, the calculation of the decoder 12 may be excessively complicated. Therefore, to simplify the calculation of the decoder 12, predetermined integers, for example, as illustrated in FIG. 5, the integers ranging from −3 to 3, in lieu of the practical LLR, may be set to the channel reliability value CNV. Here, the channel reliability value CNV may be selected to have predetermined bit-precision.

The bit-precision may mean information transmission capability between each of the variable node units and each of the check node units in the decoder 12 of FIG. 2. The bit-precision may be determined depending on processing/calculating capability of the check node unit. When the processing/calculating capability of the check node unit is increased, the bit-precision may be increased. The processing/calculating capability of the check node unit is directly related to the decoding performance. Hence, as the bit-precision is increased, the performance of the decoder 12 may be enhanced.

In other words, the bit-precision of the decoder 12 may indicate the number of bits capable of being transmitted between each variable node unit and each check node unit during each iteration. When the bit-precision of the decoder 12 is p bits and the bit-precision of the channel reliability value CNV is also determined to be p bits, each of the channel reliability value CNV included in the channel reliability value table CNVTB may have a magnitude ranging from 0 to $(2^{(p-1)})-1$. For instance, when the bit-precision is 3 bits, the channel reliability value CNV may be limited to having a magnitude ranging from 0 to 3 using 2 bits, as illustrated in FIG. 5. In other words, 2 bits of the 3 bits of the bit-precision may be used to indicate magnitude information of the channel reliability value CNV. In other words, 1 bit of the 3 bits of the bit-precision may be used to indicate sign information about whether the sign of the channel reliability value CNV is '+' or '−'.

FIGS. 6A to 6C are diagrams illustrating a method of starting, by the initial processing unit INTU of the variable node unit VN1 of FIG. 4, the initial iteration of the decoding operation in accordance with an embodiment.

Referring to FIG. 6A, the initial processing unit INTU may receive the channel reliability value CNV from the channel reliability value determination unit 11 of FIG. 3, and start the initial iteration of the decoding operation on the hard decision bit HD based on the channel reliability value CNV.

During the initial iteration, the initial processing unit INTU may transmit the channel reliability value CNV as the reference reliability values RFV1 and RFV2 to the check node units CN1 and CN2. In other words, during the initial iteration of the decoding operation, since information included in the variable node unit VN1 is only the cannel reliability value CNV, the initial processing unit INTU may transmit the channel reliability value CNV to the check node units CN1 and CN2.

In an embodiment, referring to FIG. 6B, the initial processing unit INTU may receive the channel reliability value CNV from the channel reliability value determination unit 11, determine reference reliability values RFV1 and RFV2 mapped to the channel reliability value CNV with reference to the initial table INTTB, and transmit the determined reference reliability values RFV1 and RFV2 to the check node units CN1 and CN2.

FIG. GC illustrates that the initial table INTTB to which the initial processing unit INTU refers. The initial table INTTB may include output values OUT respectively mapped to input values IN of the channel reliability value CNV. The input value IN of the initial table INTTB may be the channel reliability value CNV provided from the channel reliability value determination unit 11, as described with reference to FIG. 5. The output values OUT of the initial table INTTB may be selected as the reference reliability values RFV1 and RFV2 depending on the input value IN or the channel reliability value CNV. For example, the input values IN and the output values OUT of the channel reliability value CNV may be respectively the same as each other. For example, when the channel reliability value CNV is −2, the initial processing unit INTU may determine the output value OUT of −2 as each of the reference reliability values RFV1 and RFV2.

Then, the check node units CN1 and CN2 may determine the check reliability values CKV1 and CKV2 of FIG. 4 based on the reference reliability values RFV1 and RFV2, and respectively transmit the determined check reliability values CKV1 and CKV2 to the variable node unit VN1. The following description pertains to a method of operating the variable node unit VN1 after the variable node unit VN1 has received the check reliability values CKV1 and CKV2 from the check node units CN1 and CN2 during the initial iteration and/or each subsequent iteration.

FIGS. 7A and 7B are diagrams illustrating a method of performing, by the variable node unit VN1 of FIG. 4, the decoding operation in accordance with an embodiment.

Referring to FIG. 7A, the upsizing unit UPSU may receive the check reliability values CKV1 and CKV2 from the check node units CN1 and CN2 during the initial iteration and/or each subsequent iteration. Although FIG. 7A illustrates that the variable node unit VN1 also receives the channel reliability value CNV and the hard decision bit HD, the variable node unit VN1 may not always receive the channel reliability value CNV and the hard decision bit HD during each iteration. For example, the variable node unit VN1 may receive and store the channel reliability value CNV and the hard decision bit HD when the initial iteration starts, in order to use them during each iteration.

Based on the upsizing table UPSTB, the upsizing unit UPSU may determine the upsized channel reliability value UCNV mapped to the channel reliability value CNV, and the upsized check reliability values UCKV1 and UCKV2 mapped to the check reliability values CKV1 and CKV2. The upsizing unit UPSU may transmit the upsized channel reliability value UCNV and the upsized check reliability values UCKV1 and UCKV2 to the calculation unit CALU.

FIG. 7B illustrates the upsizing table UPSTB. The upsizing table UPSTB may include output values OUT respectively mapped to input values IN. The input value IN of the upsizing table UPSTB may be one among the channel reliability value CNV and the check reliability values CKV1 and CKV2. The output value OUT corresponding to the input value IN of the upsizing table UPSTB may be one among an upsized channel reliability value UCNV and upsized check reliability values UCKV1 and UCKV2 corresponding to the input value IN.

For example, when the channel reliability value CNV is −2, the upsizing unit UPSU may determine, with reference to the upsizing table UPSTB, the output value OUT of −9 mapped to the input value IN of −2, to be the upsized channel reliability value UCNV. The upsized check reliability values UCKV1 and UCKV2 may be determined in a similar manner. Since the channel reliability value CNV and the check reliability values CKV1 and CKV2 are all determined to have the same bit-precision, the input values IN of the upsizing table UPSTB may be one among the channel reliability value CNV and the check reliability values CKV1 and CKV2.

The output values OUT of the upsizing table UPSTB may be integers as multiples of LLRs of [Equation 1]. In other words, the ratio of the output values OUT of the upsizing table UPSTB may be the same as that of the LLRs. The conversion of the channel reliability value CNV and the check reliability values CKV1 and CKV2 into the upsized channel reliability value UCNV and the upsized check reliability values UCKV1 and UCKV2 based on the upsizing table UPSTB may temporarily upsize the bit-precision of the channel reliability value CNV and the check reliability values CKV1 and CKV2 to maintain the ratio of the LLRs.

Referring back to FIG. 7A, the calculation unit CALU may determine a final reliability value FV based on the upsized channel reliability value UCNV and the upsized check reliability values UCKV1 and UCKV2. For example, when the decoder 12 is operated according to the min-sum algorithm, the calculation unit CALU may determine the final reliability value FV by summing the upsized channel reliability value UCNV and the upsized check reliability values UCKV1 and UCKV2.

Consequently, the calculation unit CALU may determine the final reliability value FV while maintaining the ratio of the practical LLRs without limiting bit-precision, thereby preventing distortion from occurring when the final reliability value FV limited to predetermined bit-precision is determined. In other words, the final reliability value FV in accordance with the present disclosure may more accurately indicate the reliability of the hard decision bit HD. Furthermore, according to the present disclosure, since the upsizing unit UPSU and the downsizing unit DWSU are included in the variable node unit VN1 without changing the structure of the existing check node unit CN, the performance of the decoding operation may be enhanced.

Thereafter, the calculation unit CALU may update the hard decision bit HD based on the final reliability value FV to generate an updated hard decision bit UDHD. For example, when the decoder 12 is operated according to the min-sum algorithm, the calculation unit CALU may update the hard decision bit HD based on the sign of the final reliability value FV. In detail, when the sign of the final reliability value FV is minus, the calculation unit CALU may update the hard decision bit HD to 1. When the sign of the final reliability value FV is plus, the calculation unit CALU may update the hard decision bit HD to 0.

The calculation unit CALU may transmit the updated hard decision bit UDHD to the syndrome check unit SDRU.

The syndrome check unit SDRU may receive not only the updated hard decision bit UDHD from the variable node unit VN1 but also receive the updated hard decision bits from a plurality of variable node units included in the decoder 12. The syndrome check unit SDRU may perform a syndrome check operation on the updated hard decision bits. The syndrome check unit SDRU may transmit a result of the decoding operation to the calculation unit CALU based on the syndrome check operation.

When the decoding operation has succeeded, the calculation unit CALU may output the updated hard decision bit UDHD as an error-corrected bit CHD. On the other hand, when the decoding operation has failed, if the current count of iterations is less than the maximum count of iterations, the calculation unit CALU may start a subsequent iteration, as will be described below. The following description pertains to a method of starting, by the variable node unit VN1, each subsequent iteration other than the initial iteration.

Figure 8C:
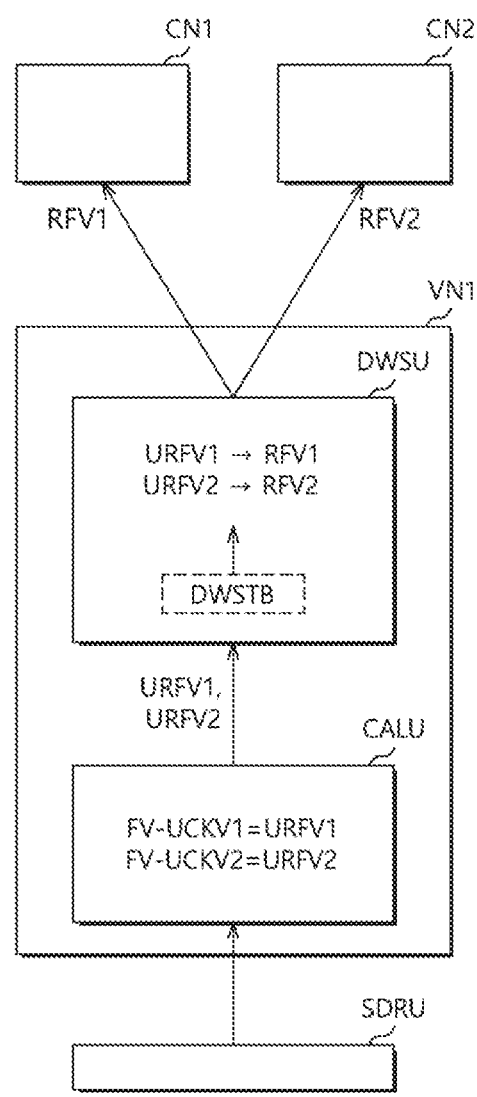

FIGS. 8A to 8C are diagrams illustrating a method of performing, by the variable node unit VN1 of FIG. 4, the decoding operation in accordance with an embodiment.

Referring to FIG. 8A, during each iteration, the calculation unit CALU may receive, from the syndrome check unit SDRU, the report that the decoding operation has failed, and start a subsequent iteration. The calculation unit CALU may determine upsized reference reliability values URFV1 and URFV2 respectively corresponding to the check node units CN1 and CN2, based on the upsized channel reliability value UCNV and the upsized check reliability values UCKV1 and UCKV2 that have been determined during the preceding iteration, and transmit the determined upsized reference reliability values URFV1 and URFV2 to the downsizing unit DWSU.

For example, when the decoder 12 is operated according to the min-sum algorithm, the calculation unit CALU may determine upsized reference reliability values URFV1 and URFV2 respectively corresponding to the check node units CN1 and CN2 by upsizing and summing extrinsic information received with respect to the respective check node units CN1 and CN2 during the preceding iteration. Generally, the extrinsic information of each check node unit may include the channel reliability value CNV and the check reliability values except for the check reliability value transmitted from that check node unit among the check reliability values transmitted to the variable node unit VN1 during the preceding iteration. For example, referring to FIG. 7, the extrinsic information of the check node unit CN1 may include the channel reliability value CNV and the check reliability value CKV2 of the check node unit CN2, and the extrinsic information of the check node unit CN2 may include the channel reliability value CNV and the check reliability value CKV1 of the check node unit CN1.

Referring back to FIG. 8A, the calculation unit CALU may determine the sum of upsized extrinsic information with respect to each of the check node units CN1 and CN2 as an upsized reference reliability value corresponding to the check node unit.

In detail, upsized extrinsic information of the check node unit CN1 may include the upsized channel reliability value UCNV and the upsized check reliability value UCKV2. Therefore, the calculation unit CALU may determine an upsized reference reliability value URFV1 corresponding to the check node unit CN1 by summing the upsized channel reliability value UCNV and the upsized check reliability value UCKV2.

Furthermore, upsized extrinsic information of the check node unit CN2 may include the upsized channel reliability value UCNV and the upsized check reliability value UCKV1. Therefore, the calculation unit CALU may determine the upsized reference reliability value URFV2 corresponding to the check node unit CN2 by summing the upsized channel reliability value UCNV and the upsized check reliability value UCKV1.

In an embodiment, the calculation unit CALU may determine the upsized reference reliability values URFV1 and URFV2 by selectively scaling/multiplying the upsized channel reliability value UCNV and/or the upsized check reliability values UCKV1 and UCKV2 by a constant, and selectively scaling/multiplying the summed values of them by a constant.

Subsequently, the downsizing unit DWSU may determine reference reliability values RFV1 and RFV2 mapped to the upsized reference reliability values URFV1 and URFV2, based on the downsizing table DWSTB, and transmit the determined reference reliability values RFV1 and RFV2 to the check node units CN1 and CN2.

FIG. 8B illustrates the downsizing table DWSTB. The downsizing table DWSTB may include output values OUT respectively mapped to ranges of input values IN. The input value IN of the downsizing table DWSTB may be any one between the upsized reference reliability values URFV1 and URFV2. The output values OUT of the downsizing table DWSTB may be any one between the reference reliability values RFV1 and RFV2 depending on the corresponding one as the input value IN between the upsized reference reliability values URFV1 and URFV2.

For example, when the input value IN or the upsized reference reliability value URFV1 is −5, the downsizing unit DWSU may determine the output value OUT of −1 mapped to the range from −6 to −3 including the input value IN of −5, to be the reference reliability value RFV1, with reference to the downsizing table DWSTB.

In an embodiment, the ranges of the input values IN of the downsizing table DWSTB may respectively include the output values of the upsizing table UPSTB of FIG. 7B.

Since the output values OUT of the downsizing table DWSTB are the reference reliability values RFV1 and RFV2 to be transmitted to the check node units CN1 and CN2, the output values OUT may be determined to have the bit-precision of the check node units CN1 and CN2. In other words, the output values OUT of the downsizing table DWSTB may have the same magnitude range as that of the output values OUT of the channel reliability value CNV of the channel reliability value table CNVTB of FIG. 5.

Referring back to FIG. 8A, the calculation unit CALU may determine the upsized reference reliability values URFV1 and URFV2 while maintaining the ratio of the LLRs without limiting the bit-precision. The downsizing unit DWSU may downsize the upsized reference reliability values URFV1 and URFV2 such that they have the bit-precision for the check node units CN1 and CN2. Therefore, distortion may be prevented from occurring when the reference reliability values RFV1 and RFV2 are determined under limitation of predetermined bit-precision.

Thereafter, the check node units CN1 and CN2 may determine check reliability values CKV1 and CKV2 of FIG. 4 based on the reference reliability values RFV1 and RFV2, and respectively transmit the determined check reliability values CKV1 and CKV2 to the variable node unit VN1. The variable node unit VN1 may receive the check reliability values CKV1 and CKV2 from the check node units CN1 and CN2 and perform the operation of FIG. 7A.

When comparing FIG. 8C with FIG. 8A, there is a difference in a calculation method of the calculation unit CALU. The difference from FIG. 8A will be first described with reference to FIG. 8C. The calculation unit CALU may determine upsized reference reliability values URFV1 and URFV2 corresponding to the check node units CN1 and CN2 by subtracting the upsized check reliability values UCKV1 and UCKV2 of the check node units CN1 and CN2 from the final reliability value FV, respectively. In other words, since the final reliability value FV is the sum of the upsized channel reliability value UCNV and the upsized check reliability values UCKV1 and UCKV2, the upsized reference reliability values URFV1 and URFV2 determined by the calculation unit CALU of FIG. 8C may be the same as the upsized reference reliability values URFV1 and URFV2 determined by the calculation unit CALU of FIG. 8A. The other operations in FIG. 8C are substantially the same as those of FIG. 8A. Therefore, detailed explanation thereof will be omitted.

FIG. 9 is a flowchart illustrating a method of operating the error correction device 10 of FIG. 1 in accordance with an embodiment.

Referring to FIG. 9, at step S110, the channel reliability value determination unit 11 may receive hard decision bits HDD and soft decision bit sets SDD. The soft decision bit sets SDD may respectively correspond to the hard decision bits HDD. Each soft decision bit set SD may indicate the degree of reliability of the corresponding hard decision bit HD.

At step S120, the channel reliability value determination unit 11 may determine channel reliability values CNVD of the hard decision bits HDD based on the hard decision bits HDD and the soft decision bit sets SDD. The channel reliability values CNVD may respectively correspond to the soft decision bit sets SDD. Each channel reliability value CNV may be determined based on corresponding soft decision bit set SD and hard decision bit HD, as described with reference to FIG. 5. The channel reliability value determination unit 11 may transmit the hard decision bits HDD and the channel reliability values CNVD to the decoder 12.

At step S130, the decoder 12 may receive the hard decision bits HDD and the channel reliability values CNVD, and perform a decoding operation on the hard decision bits HDD based on the channel reliability values CNVD.

At step S140, the decoder 12 may output error-corrected bits CHDD depending on a result of the decoding operation. In detail, if the decoding operation has succeeded, the decoder 12 may output the error-corrected bits CHDD. On the other hand, if the decoding operation has failed, the decoder 12 may output a decoding failure report.

Figure 10:
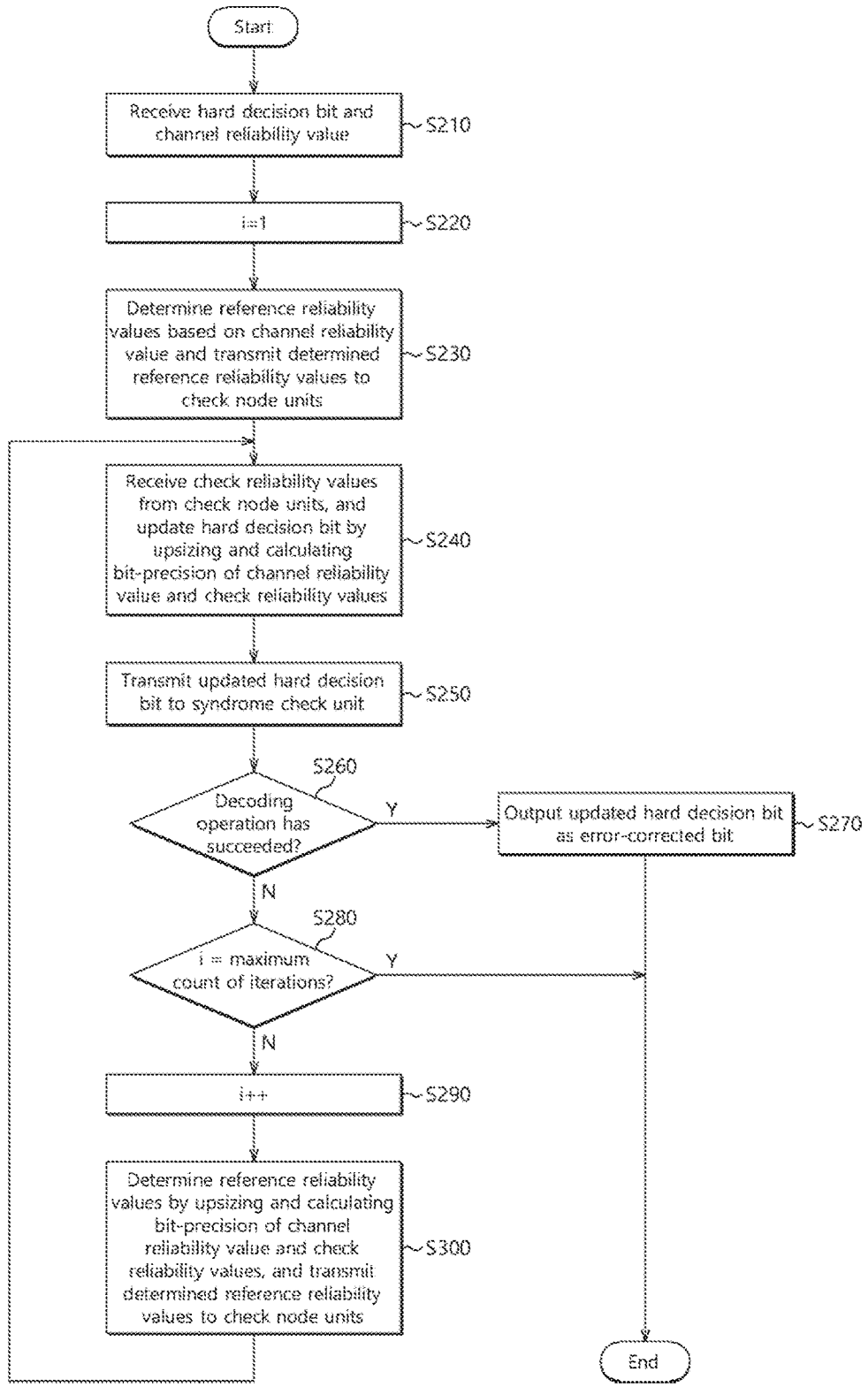
FIG. 10 is a flowchart illustrating a method of operating the variable node unit of FIG. 3 in accordance with an embodiment.

FIG. 10 is a flowchart illustrating a method of operating the variable node unit VN1 of FIG. 3 in accordance with an embodiment. The process of FIG. 10 may be included in step S130 of FIG. 9 at which the decoding operation is performed on the hard decision bits HDD. Each of the plurality of variable node units of FIG. 2, representatively, the variable node unit VN1 of FIG. 3 may be operated according to the process of FIG. 10 when the decoding operation is performed.

Referring to FIG. 10, at step S210, the variable node unit VN1 may receive a hard decision bit HD and a channel reliability value CNV.

At step S220, the variable node unit VN1 may set an iteration count "i" to 1.

At step S230, the variable node unit VN1 may determine reference reliability values RFV1 and RFV2 based on the channel reliability value CNV, and transmit the determined reference reliability values RFV1 and RFV2 to the check node units CN1 and CN2, as described with reference to FIGS. 6A to 6C. Each of the check node units CN1 and CN2 may receive the reference reliability values from one or more variable node units coupled thereto, and determine a check reliability value based on the reference reliability values.

At step S240, the variable node unit VN1 may receive check reliability values CKV1 and CKV2 from the check node units CN1 and CN2, and update the hard decision bit HD by upsizing and calculating bit-precision of the channel reliability value CNV and the check reliability values CKV1 and CKV2, as described with reference to FIGS. 7A and 7B. In detail, the variable node unit VN1 may determine a final reliability value FV by upsizing and calculating the bit-precision of the channel reliability value CNV and the check reliability values CKV1 and CKV2, and update the hard decision bit HD according to the final reliability value FV.

At step S250, the variable node unit VN1 may transmit an updated hard decision bit UDHD to the syndrome check unit SDRU, as described with reference to FIGS. 3, 4 and 7A. The syndrome check unit SDRU may receive the updated hard decision bits from the variable node units included in the decoder 12, determine a result of the decoding operation by performing a syndrome check operation on the updated hard decision bits, and transmit the result of the decoding operation to the variable node units.

At step S260, the variable node unit VN1 may determine whether the decoding operation has succeeded, as described with reference to FIGS. 3, 4 and 7A. If the decoding operation has succeeded, the process may proceed to step S270. However, if the decoding operation has failed, the process may proceed to step S280.

At step S270, if the decoding operation has succeeded, the variable node unit VN1 may output the updated hard decision bit UDHD as an error-corrected bit CHD. Therefore, the process may be terminated.

At step S280, if the decoding operation has failed, the variable node unit VN1 may determine whether the iteration count "i" has reached the maximum iteration count. In the case where the iteration count "i" has reached the maximum iteration count, the process may be terminated. In this case, the decoder 12 may output a decoding failure report. In the case where the iteration count "i" has not reached the maximum iteration count, the process may proceed to step S290.

At step S290, the variable node unit VN1 may increase the iteration count "i". In other words, a new iteration of the decoding operation may start.

At step S300, the variable node unit VN1 may determine reference reliability values RFV1 and RFV2 respectively corresponding to the check node units CN1 and CN2 by upsizing and calculating the bit-precision of the channel reliability value CNV and the check reliability values CKV1 and CKV2 of the preceding iteration, and transmit the determined reference reliability values RFV1 and RFV2 to the check node units CN1 and CN2, as described with reference to FIGS. 8A to 8C. Each of the check node units CN1 and CN2 may receive reference reliability values from one or more variable node units coupled thereto, and determine a check reliability value CKV1, CKV2 based on the reference reliability values. Then, the process may proceed to step S240. In other words, the variable node unit VN1 may repeat steps S240 to S290 during the new iteration.

In order to obtain the upsized channel reliability value UCNV and the upsized check reliability values UCKV1 and UCKV2 at step S300, the variable node unit VN1 may separately upsize, based on the upsizing table UPSTB, the bit-precision of the channel reliability value CNV and the check reliability values CKV1 and CKV2 of steps S210 and S230 within the preceding iteration or may reuse the upsized channel reliability value UCNV and the upsized check reliability values UCKV1 and UCKV2 of step S240 within the preceding iteration.

Figure 11A:
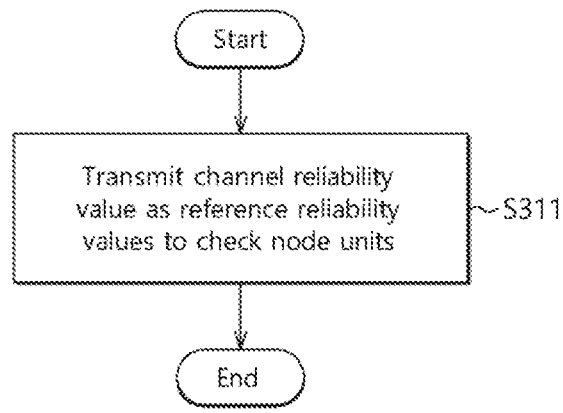
FIGS. 11A and 11B are flowcharts illustrating a method of operating the variable node unit of FIGS. 6A and 6B in accordance with an embodiment.
Figure 11B:
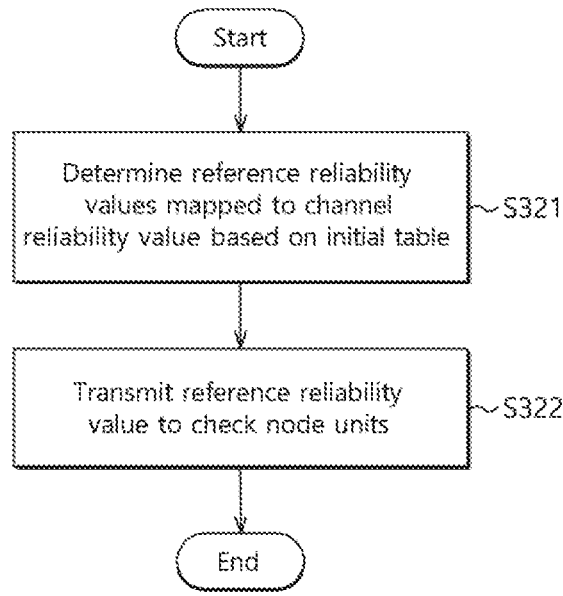

FIGS. 11A and 11B are flowcharts illustrating a method of operating the variable node unit VN1 of FIGS. 6A to 6C in accordance with an embodiment. The processes of FIGS. 11A and 11B may be detailed embodiments of step S230 of FIG. 10. The processes of FIGS. 11A and 11B may proceed as the variable node unit VN1 starts the initial iteration of the decoding operation.

Referring to FIG. 11A, at step S311, the initial processing unit INTU of the variable node unit VN1 may transmit the channel reliability value CNV as each of the reference reliability values RFV1 and RFV2 to the check node units CN1 and CN2.

Referring to FIG. 11B, at step S321, the initial processing unit INTU may determine reference reliability values RFV1 and RFV2 mapped to the channel reliability value CNV based on the initial table INTTB.

At step S322, the initial processing unit INTU may transmit the reference reliability values RFV1 and RFV2 to the check node units CN1 and CN2.

Figure 12:
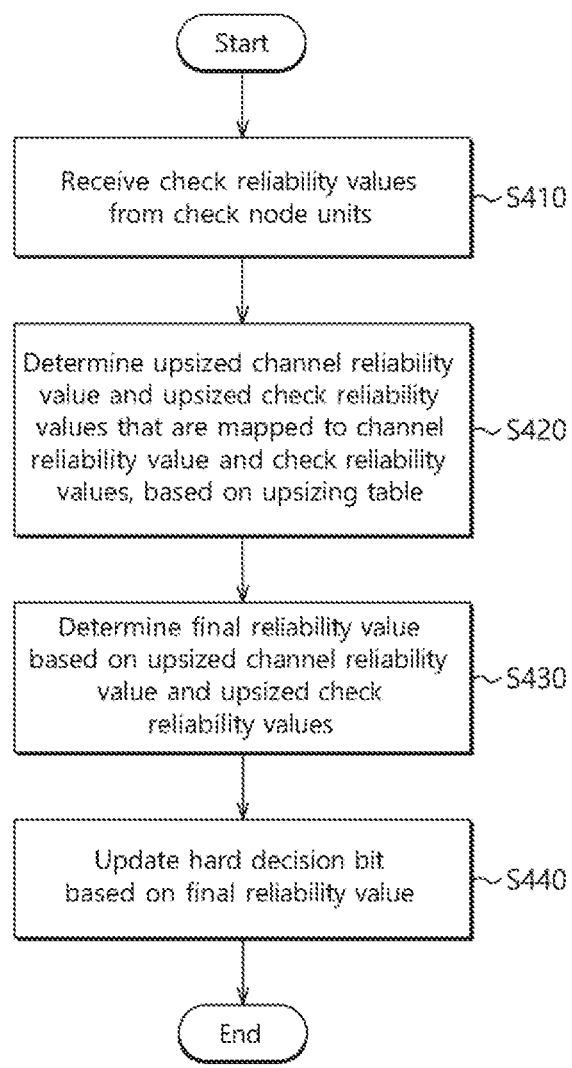
FIG. 12 is a flowchart illustrating a method of operating the variable node unit of FIG. 7 in accordance with an embodiment.

FIG. 12 is a flowchart illustrating a method of operating the variable node unit VN1 of FIGS. 7A and 7B in accordance with an embodiment. The process of FIG. 12 may be a detailed embodiment of step S240 of FIG. 10. The process of FIG. 12 may be performed as the variable node unit VN1 receives check reliability values CKV1 and CKV2 from the check node units CN1 and CN2 during the initial iteration and/or each subsequent iteration.

Referring to FIG. 12, at step S410, the upsizing unit UPSU may receive the check reliability values CKV1 and CKV2 from the check node units CN1 and CN2.

At step S420 the upsizing unit UPSU may determine, based on the upsizing table UPSTB, an upsized channel reliability value UCNV and upsized check reliability values UCKV1 and UCKV2 that are respectively mapped to the channel reliability value CNV and the check reliability values CKV1 and CKV2.

At step S430, the calculation unit CALU may determine a final reliability value FV based on the upsized channel reliability value UCNV and the upsized check reliability values UCKV1 and UCKV2. For example, when the decoder 12 is operated according to a min-sum algorithm, the calculation unit CALU may determine the final reliability value FV by summing the upsized channel reliability value UCNV and the upsized check reliability values UCKV1 and UCKV2.

At step S440, the calculation unit CALU may update the hard decision bit HD based on the final reliability value FV. For example, when the decoder 12 is operated according to the min-sum algorithm, the calculation unit CALU may update the hard decision bit HD based on the sign of the final reliability value FV.

Figure 13A:
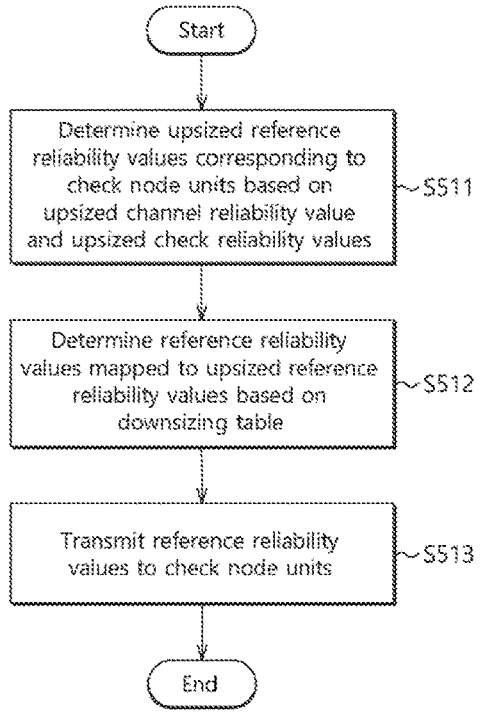
FIGS. 13A and 13B are flowcharts illustrating methods of operating the variable node unit of FIGS. 8A and 8C in accordance with an embodiment.
Figure 13B:
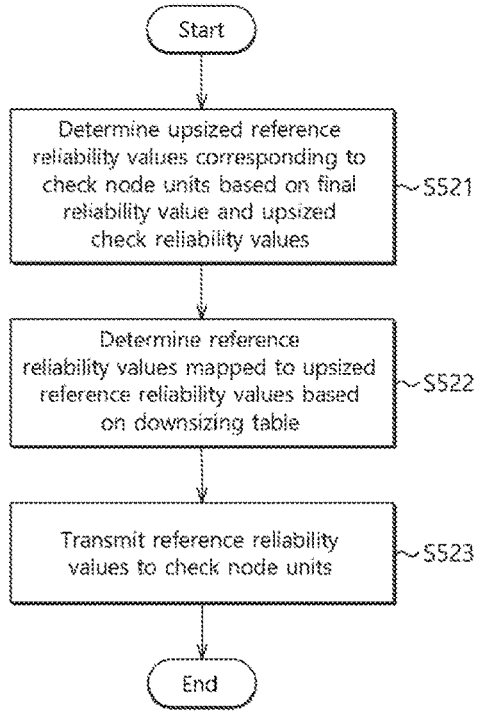

FIGS. 13A and 13B are flowcharts illustrating methods of operating the variable node unit VN1 of FIGS. 8A to 8C in accordance with an embodiment. The processes of FIGS. 13A and 13B may be detailed embodiments of step S300 of FIG. 10. The processes of FIGS. 13A and 13B may proceed as the variable node unit VN1 starts each subsequent iteration other than the initial iteration.

Referring to FIG. 13A, at step S511, the calculation unit CALU may determine upsized reference reliability values URFV1 and URFV2 respectively corresponding to the check node units CN1 and CN2, based on the upsized channel reliability value UCNV and the upsized check reliability values UCKV1 and UCKV2 of the preceding iteration. The calculation unit CALU may use the values determined by the upsizing unit UPSU at step S420 of FIG. 12 as the upsized channel reliability value UCNV and the upsized check reliability values UCKV1 and UCKV2 of the preceding iteration. The calculation unit CALU may sum extrinsic information for each of the check node units CN1 and CN2, thus determining the upsized reference reliability values URFV1 and URFV2 respectively corresponding to the check node units CN1 and CN2.

At step S512, the downsizing unit DWSU may determine reference reliability values RFV1 and RFV2 mapped to the upsized reference reliability values URFV1 and URFV2, based on the downsizing table DWSTB.

At step S513, the downsizing unit DWSU may transmit the reference reliability values RFV1 and RFV2 to the check node units CN1 and CN2, respectively.

Referring to FIG. 13B, at step S521, the calculation unit CALU may determine upsized reference reliability values URFV1 and URFV2 respectively corresponding to the check node units CN1 and CN2, based on the final reliability value FV and the upsized check reliability values UCKV1 and UCKV2 of the preceding iteration. The calculation unit CALU may use the values determined by the calculation unit CALU at step S430 of FIG. 12 as the final reliability value FV of the preceding iteration. The calculation unit CALU may use the values determined by the upsizing unit UPSU at step S420 of FIG. 12 as the upsized check reliability values UCKV1 and UCKV2 of the preceding iteration. The calculation unit CALU may subtract each of the upsized check reliability values UCKV1 and UCKV2 of the check node units CN1 and CN2 from the final reliability value FV for the corresponding check node unit, thus determining the upsized reference reliability values URFV1 and URFV2 respectively corresponding to the check node units CN1 and CN2.

At step S522, the downsizing unit DWSU may determine reference reliability values RFV1 and RFV2 mapped to the upsized reference reliability values URFV1 and URFV2, based on the downsizing table DWSTB.

At step S523, the downsizing unit DWSU may transmit the reference reliability values RFV1 and RFV2 to the check node units CN1 and CN2, respectively.

FIG. 14A is a block diagram illustrating an error correction device 20 in accordance with an embodiment.

Referring to FIG. 14a, the error correction device 20 may include a channel reliability value determination unit 21 and a decoder 22.

The channel reliability value determination unit 21 may determine an external channel reliability value SCNV of the hard decision bit HD based on the corresponding soft decision bit set SD, and transmit the hard decision bit HD and the external channel reliability value SCNV to the decoder 22. The channel reliability value determination unit 21 may determine, with reference to a channel reliability value table SCNVTB, the external channel reliability value SCNV mapped to the soft decision bit set SD.

Bit-precision (hereinafter, referred to as channel bit-precision) of the external channel reliability value SCNV outputted from the channel reliability value determination unit 21 may be lower than bit-precision (hereinafter, referred to as decoder bit-precision) which is determined depending on calculating/processing capabilities of the check node units CN1 and CN2. This configuration of the channel reliability value determination unit 21 is different from that of the channel reliability value determination unit 11 of FIG. 3 in which the channel bit-precision is determined to be identical with the decoder bit-precision by the channel reliability value determination unit 11. The error correction device 20 may be similar to the error correction device 10 of FIG. 3, except the configuration of the channel reliability value determination unit 21. Hereinafter, the characteristics of the error correction device 20 will be described, focused on differences from the error correction device 10.

FIG. 14B is a diagram illustrating the channel reliability value table SCNVTB to which the channel reliability value determination unit 21 of FIG. 14A refers, in accordance with an embodiment.

Referring to FIG. 14B, in a manner similar to the channel reliability value table CNVTB of FIG. 5, the channel reliability value table SCNVTB may include the external channel reliability value SCNV as an output value corresponding to a value of the soft decision bit set SD as an input value. The soft decision bit set SD may correspond to the hard decision bit HD. The channel reliability value table SCNVTB may include a plurality of possible values SD11 to SD14 of the soft decision bit set SD each mapped to a corresponding external channel reliability value SCNV. The external channel reliability value SCNV may have a magnitude ranging from 0 to 1 and a sign of '−' or '+'. In other words, the external channel reliability value SCNV may have the bit-precision of 2 bits. Here, the decoder bit-precision of the decoder 12 may be, for example, 3 bits. That is, in the error correction device 20, the channel bit-precision may be lower than the decoder bit-precision.

Referring back to FIG. 14A, the decoder 22 may receive the hard decision bit HD and the external channel reliability value SCNV, and output an error-corrected bit CHD by performing a decoding operation on the hard decision bit HD based on the external channel reliability value SCNV.

The decoder 22 may include a variable node unit VN21, check node units CN1 and CN2, and a syndrome check unit SDRU. The check node units CN1 and CN2 and the syndrome check unit SDRU of FIG. 14A may be operated in the same manner as the check node units CN1 and CN2 and the syndrome check unit SDRU of FIG. D.

The variable node unit VN21 may receive the hard decision bit HD and the external channel reliability value SCNV, and output an error-corrected bit CHD by performing a decoding operation. Particularly, as will be described below, the variable node unit VN21 may first upsize the channel bit-precision of the external channel reliability value SCNV to the decoder bit-precision.

Figures 15A, 15B:
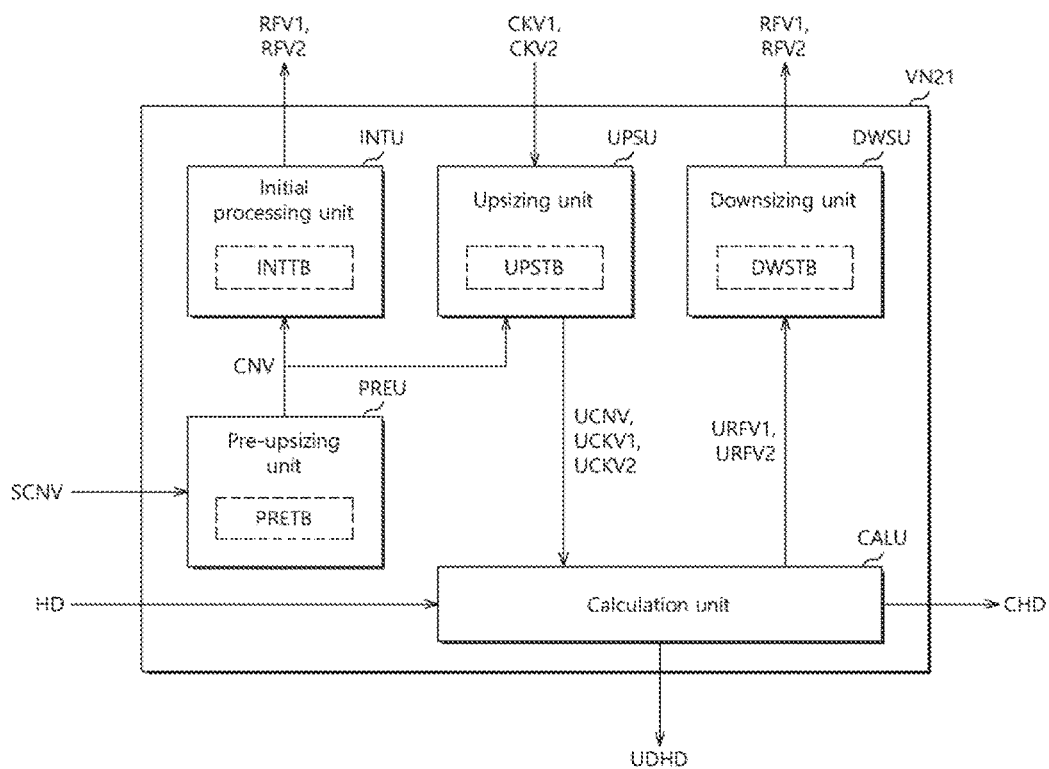
FIG. 15A is a block diagram illustrating in detail a variable node unit of FIG. 14A in accordance with an embodiment.
FIG. 15B is a diagram illustrating a pre-upsizing table to which a pre-upsizing unit of FIG. 15A refers, in accordance with an embodiment.

FIG. 15A is a block diagram illustrating in detail the variable node unit VN21 of FIG. 14A in accordance with an embodiment.

Referring to FIG. 15A, the variable node unit VN21 may include a pre-upsizing unit PREU, an initial processing unit INTU, an upsizing unit UPSU, a calculation unit CALU, and a downsizing unit DWSU.

The pre-upsizing unit PREU may receive the external channel reliability value SCNV from the channel reliability value determination unit 21 of FIG. 14A, determine a channel reliability value CNV mapped to the external channel reliability value SCNV based on a pre-upsizing table PRETB, and transmit the determined channel reliability value CNV to the initial processing unit INTU and the upsizing unit UPSU. The pre-upsizing unit PREU may upsize the channel bit-precision of the external channel reliability value SCNV to the decoder bit-precision, based on the pre-upsizing table PRETB.

FIG. 15B is a diagram illustrating the pre-upsizing table PRETB to which the pre-upsizing unit PREU of FIG. 15A refers, in accordance with an embodiment.

Referring to FIG. 15B, the pre-upsizing table PRETB may include the channel reliability value CNV as an output value corresponding to the external channel reliability value SCNV as an input value. The pre-upsizing unit PREU or the input value IN of the pre-upsizing table PRETB may have a magnitude ranging from 0 to 1 and a sign of '−' or '+'. The channel reliability value CNV or the output value OUT of the pre-upsizing table PRETB may have a magnitude ranging from 0 to 3 and a sign of '−' or '+' depending on the corresponding input value.

As described above, the channel bit-precision of the external channel reliability value SCNV may be 2 bits respectively indicating the magnitude ranging from 0 to 1 and the sign, and the decoder bit-precision may be 3 bits, 2 bits of which indicate the magnitude ranging from 0 to 3 and 1 bit of which indicates the sign. Therefore, to upsize the channel bit-precision of 2 bits to 3 bits, the output values OUT of the pre-upsizing table PRETB may be selected from among values having the bit-precision of 3 bits. In other words, the magnitude of each of the output values OUT of the pre-upsizing table PRETB may be selected within a range from 0 to 3. Although FIG. 15B illustrates that the magnitude of each of the output values OUT is 1 or 3, the magnitude may be 0 or 2 in some embodiments.

Referring back to FIG. 15A, since the channel bit-precision of the external channel reliability value SCNV has been upsized to that of the decoder bit-precision and then converted into the channel reliability value CNV, the initial processing unit INTU, the upsizing unit UPSU, the calculation unit CALU, and the downsizing unit DWSU of FIG. 15A may be operated in the same manner as the initial processing unit INTU, the upsizing unit UPSU, the calculation unit CALU, and the downsizing unit DWSU of FIG. 4.

In the above-mentioned embodiments, when iterations are repeated, the variable node unit VN1 of FIG. 4 may continually use the same upsizing table UPSTB and the same downsizing table DWSTB. Furthermore, during each iteration, the plurality of variable node units VN included in the decoder 12 of FIG. 2 may use the same upsizing table UPSTB and the same downsizing table DWSTB.

In accordance with embodiments which will be described below, the variable node unit VN1 may use a plurality upsizing tables and/or a plurality of downsizing tables.

Figure 16:
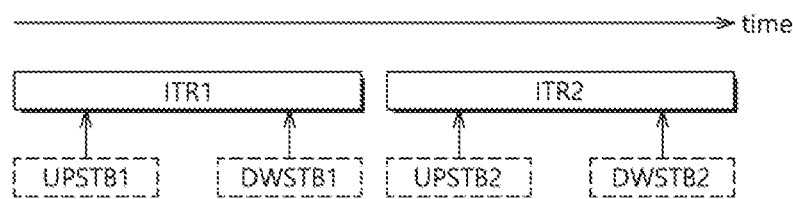
FIG. 16 is a diagram illustrating a method of using, by the variable node unit of FIG. 3, different upsizing tables and/or different downsizing tables while repeating iterations, in accordance with an embodiment.

FIG. 16 is a diagram illustrating a method of using, by the variable node unit VN1 of FIG. 3, different upsizing tables UPSTB1 and UPSTB2 and/or different downsizing tables DWSTB1 and DWSTB2 while performing iterations ITR1 and ITR2, in accordance with an embodiment.

Referring to FIG. 16, when the iterations ITR1 and ITR2 are performed, the upsizing unit UPSU of the variable node unit VN1 may use the first upsizing table UPSTB1 during the first iteration ITR1, and use the second upsizing table UPSTB2 different from the first upsizing table UPSTB1 during the second iteration ITR2. When the iterations ITR1 and ITR2 are performed, the downsizing unit DWSU of the variable node unit VN1 may use the first downsizing table DWSTB1 during the first iteration ITR1, and use the second downsizing table DWSTB2 different from the first downsizing table DWSTB1 during the second iteration ITR2.

In an embodiment, when the iterations ITR1 and ITR2 are performed, both or any one of the upsizing table UPSTB and the downsizing table DWSTB may be changed.

The first and second upsizing tables UPSTB1 and UPSTB2 and the first and second downsizing tables DWSTB1 and DWSTB2 may be provided from the outside of the error correction device 10 or may be stored in an internal table memory of the error correction device 10.

In an embodiment, the variable node unit VN1 may further include a table selection unit (not illustrated). The table selection unit may select the upsizing table UPSTB and the downsizing table DWSTB to be used during each iteration. The table selection unit may request the selected upsizing table UPSTB and the selected downsizing table DWSTB from the outside of the error correction device 10, or read them from the internal table memory of the error correction device 10.

In an embodiment, the table selection unit may generate the first and second upsizing tables UPSTB1 and UPSTB2 and the first and second downsizing tables DWSTB1 and DWSTB2 by adding or subtracting predetermined adjustment values to or from a basic upsizing table and a basic downsizing table. The basic upsizing table, the basic downsizing table, and the adjustment value may be provided from the outside of the error correction device 10 or stored in the internal table memory of the error correction device 10.

In an embodiment, when the iterations ITR1 and ITR2 are repeated, a sequence of applying the first and second upsizing tables UPSTB1 and UPSTB2 and the first and second downsizing tables DWSTB1 and DWSTB2 may comply with preset sequences. In an embodiment, a sequence of a plurality of upsizing tables and/or a sequence of a plurality of downsizing tables may be preset, and an upsizing table and/or a downsizing table to be used during each iteration may be sequentially selected from the corresponding sequences.

As the number of error bits included in updated hard decision bits to be transmitted to the syndrome check unit SDRU is increased, the number of "1" included in syndrome vectors calculated by the syndrome check unit SDRU may be generally increased. In an embodiment, depending on the number of "1" in syndrome vectors calculated during a preceding iteration, the second upsizing table UPSTB2 and/or the second downsizing table DWSTB2 to be used during a subsequent iteration may be selected. A scheme of selecting an upsizing table and/or a downsizing table to be used during the subsequent iteration depending on the number of "1" included in the syndrome vectors calculated during the preceding iteration may be preset.

Figure 17:
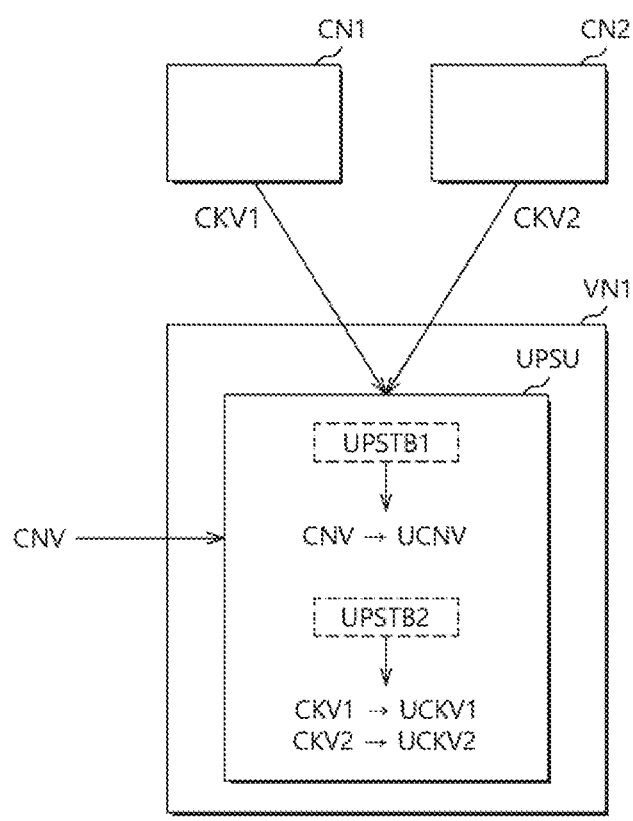
FIG. 17 is a diagram illustrating a method of using, by an upsizing unit of the variable node unit, different upsizing tables in accordance with an embodiment.

FIG. 17 is a diagram illustrating a method of using, by the upsizing unit UPSU of the variable node unit VN1, different upsizing tables UPSTB1 and UPSTB2 in accordance with an embodiment.

Referring to FIG. 17, the upsizing unit UPSU may use different upsizing tables UPSTB1 and UPSTB2 with regard to the channel reliability value CNV and the check reliability values CKV1 and CKV2 during a certain iteration of the decoding operation. For example, the upsizing unit UPSU may determine an upsized channel reliability value UCNV for the channel reliability value CNV using the first upsizing table UPSTB1. The upsizing unit UPSU may determine upsized check reliability values UCKV1 and UCKV2 for the check reliability values CKV1 and CKV2 using the second upsizing table UPSTB2.

If three or more check node units are coupled to the variable node unit VN1, the upsizing unit UPSU may use the second upsizing table UPSTB2 with respect to check reliability values transmitted from the corresponding check node units.

Figure 18:
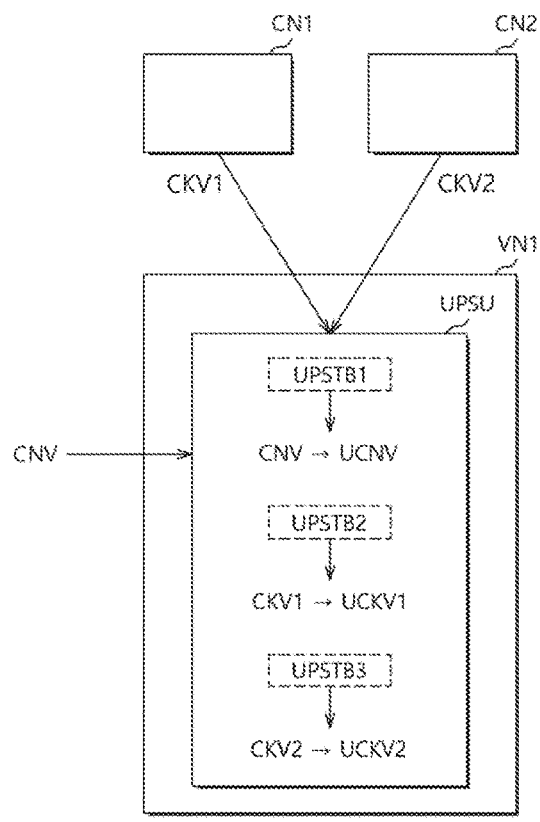
FIG. 18 is a diagram illustrating a method of using, by the upsizing unit of the variable node unit, different upsizing tables in accordance with an embodiment.

FIG. 18 is a diagram illustrating a method of using, by the upsizing unit UPSU of the variable node unit VN1, different upsizing tables UPSTB1 to UPSTB3 in accordance with an embodiment.

Referring to FIG. 18, the upsizing unit UPSU may use different upsizing tables UPSTB1 to UPSTB3 with respect to all of the channel reliability value CNV and the check reliability values CKV1 and CKV2 during a certain iteration of the decoding operation. For example, the upsizing unit UPSU may determine an upsized channel reliability value UCNV for the channel reliability value CNV using the first upsizing table UPSTB1. The upsizing unit UPSU may determine an upsized check reliability value UCKV1 for the check reliability value CKV1 using the second upsizing table UPSTB2. The upsizing unit UPSU may determine an upsized check reliability value UCKV2 for the check reliability value CKV2 using the third upsizing table UPSTB3.

If three or more check node units are coupled to the variable node unit VN1, the upsizing unit UPSU may use the second upsizing table UPSTB2 for at least one of check reliability values transmitted from the corresponding check node units, and use the third upsizing table UPSTB3 for at least another one.

Figure 19:
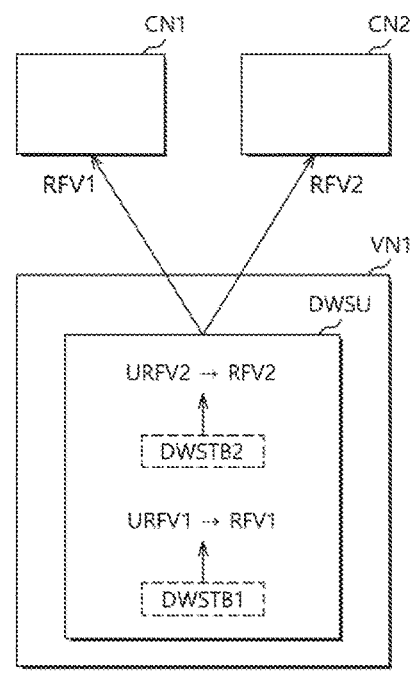
FIG. 19 is a diagram illustrating a method of using, by a downsizing unit of the variable node unit, different downsizing tables in accordance with an embodiment.

FIG. 19 is a diagram illustrating a method of using, by the downsizing unit DWSU of the variable node unit VN1, different downsizing tables DWSTB1 and DWSTB2 in accordance with an embodiment.

Referring to FIG. 19, the downsizing unit DWSU may use the different downsizing tables DWSTB1 and DWSTB2 for the upsized reference reliability values URFV1 and URFV2 respectively corresponding to the check node units CN1 and CN2 during a certain iteration of the decoding operation. In other words, the downsizing unit DWSU may use the different downsizing tables DWSTB1 and DWSTB2 for the respective check node units. For example, the downsizing unit DWSU may determine a reference reliability value RFV1 for the upsized reference reliability value URFV1 corresponding to the check node unit CN1 using the first downsizing table DWSTB1. Furthermore, the downsizing unit DWSU may determine a reference reliability value RFV2 for the upsized reference reliability value URFV2 corresponding to the check node unit CN2 using the second downsizing table DWSTB2.

If three or more check node units are coupled to the variable node unit VN1, the downsizing unit DWSU may use the first downsizing table DWSTB1 for at least one of the upsized reference reliability values URFV1 and URFV2 respectively corresponding to the associated check node units, and use the second downsizing table DWSTB2 for at least another one.

Figure 20:
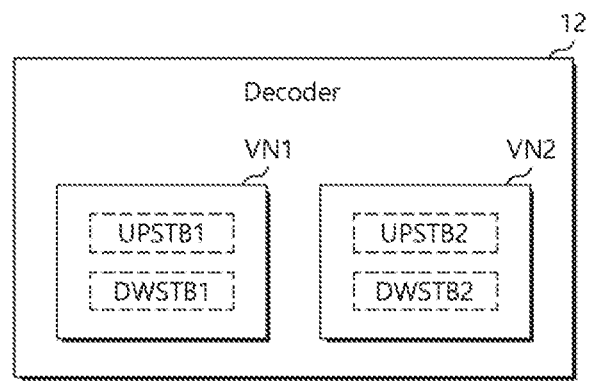
FIG. 20 is a diagram illustrating a method of using, by variable node units, different upsizing tables and different downsizing tables in accordance with an embodiment.

FIG. 20 is a diagram illustrating a method of using, by variable node units, different upsizing tables UPSTB1 and UPSTB2 and different downsizing tables DWSTB1 and DWSTB2 in accordance with an embodiment.

Referring to FIG. 20, the decoder 12 may include a first variable node unit VN1 and a second variable node unit VN2. The first variable node unit VN1 and the second variable node unit VN2 may use the different upsizing tables UPSTB1 and UPSTB2 and/or the different downsizing tables DWSTB1 and DWSTB2 during a certain iteration of the decoding operation. For example, the first variable node unit VN1 may use the first upsizing table UPSTB1 and the first downsizing table DWSTB1, and the second variable node unit VN2 may use the second upsizing table UPSTB2 and the second downsizing table DWSTB2.

When the decoder 12 includes a plurality of variable node units VN, a first group of at least one variable node unit VN may use the first upsizing table UPSTB1 and the first downsizing table DWSTB1, and a second group of at least another variable node unit VN may use the second upsizing table UPSTB2 and the second downsizing table DWSTB2. In an embodiment, the first group and the second group may be randomly determined. In an embodiment, the first group and the second group may be divided by the number of check node units coupled to each variable node unit. For instance, each variable node unit included in the first group may be coupled with one check node unit. Each variable node unit included in the second group may be coupled with two check node units.

In an embodiment, the methods of using a plurality of upsizing tables and/or a plurality of downsizing tables of FIGS. 16 to 20 may be combined with each other.

Figure 21:
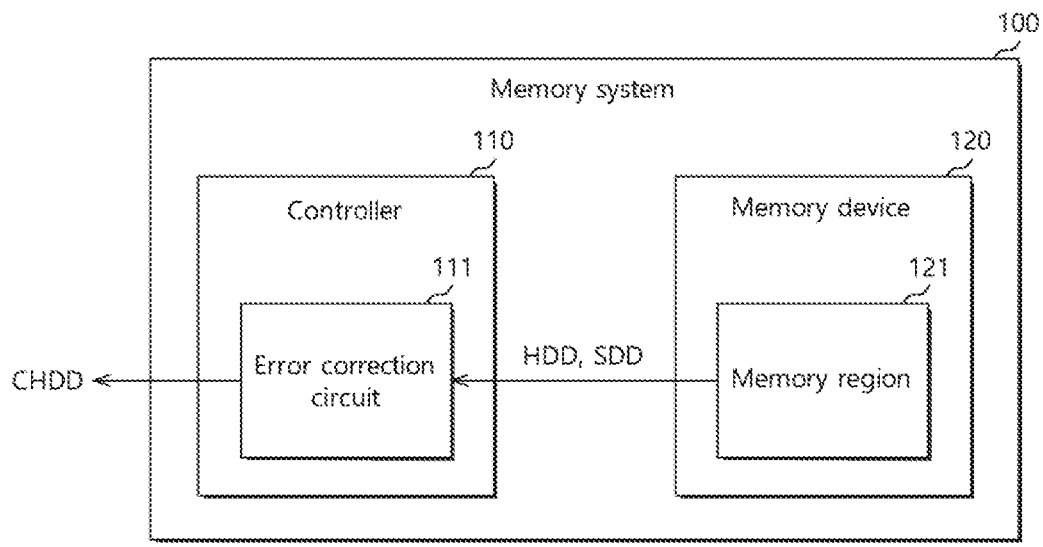
FIG. 21 is a block diagram illustrating a memory system in accordance with an embodiment.

FIG. 21 is a block diagram illustrating a memory system 100 in accordance with an embodiment.

Referring to FIG. 21, the memory system 100 may be configured to store, in response to a write request from an external host device, data provided from the host device. Furthermore, the memory system 100 may be configured to provide the stored data to the host device in response to a read request of the host device.

The memory system 100 may be configured as a personal computer memory card international association (PCMCIA) card, a compact flash (CF) card, a smart media card, a memory stick, (various multimedia cards such as MMC, eMMC, RS-MMC or MMC-micro, a secure digital card such as SD, mini-SD or micro-SD, a universal flash storage (UFS), a solid state drive (SSD), or the like.

The memory system 100 may include a controller 110 and a memory device 120.

The controller 110 may control overall operations of the memory system 100. The controller 110 may access the memory device 120 to process a request of the host device. Furthermore, the controller 110 may access the memory device 120 to perform an internal management operation or a background operation of the memory system 100 regardless of a request of the host device. The access to the memory device 120 may include a write access and a read access.

The controller 110 may include an error correction circuit 111. The error correction circuit 111 may perform an error correction operation on hard decision bits HDD and soft decision bit sets SDD that are read from a memory region 121 of the memory device 120, and may output error-corrected bits CHDD. The error correction circuit 111 may include the error correction device 10 of FIG. 1 or the error correction device 20 of FIG. 14A.

Under control of the controller 110, the memory device 120 may store data transmitted from the controller 110, or read and transmit the stored data to the controller 110. The memory device 120 may include the memory region 121. The memory region 121 may include a plurality of memory cells (not illustrated).

The memory device 120 may include a nonvolatile memory device and a volatile memory device. The nonvolatile memory device may include a flash memory, such as a NAND flash or a NOR flash, a Ferroelectrics Random Access Memory (FeRAM), a Phase-Change Random Access Memory (PCRAM), a Magnetoresistive Random Access Memory (MRAM), a Resistive Random Access Memory (ReRAM), and the like. The volatile memory device may include a Static Random Access Memory (SRAM), a Dynamic Random Access Memory (DRAM), and the like.

Figure 22:
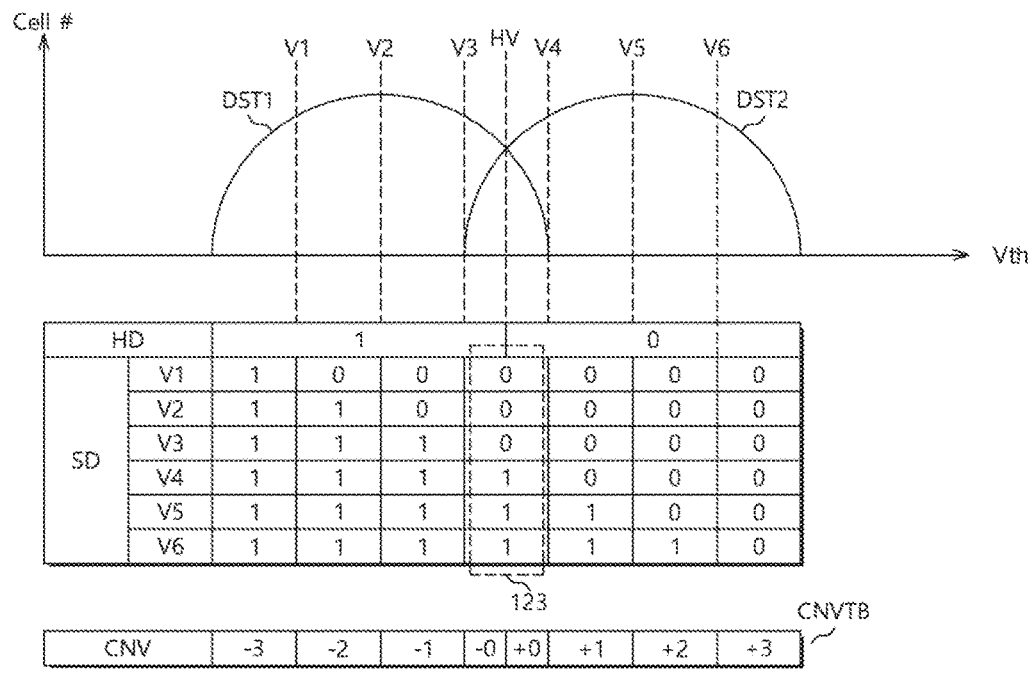
FIG. 22 is a diagram for describing a method of reading a hard decision bit and a soft decision bit set from memory cells of a memory region of FIG. 19, in accordance with an embodiment.

FIG. 22 is a diagram for describing a method of reading a hard decision bit HD and a corresponding soft decision bit set SD from the memory cells of the memory region 121 of FIG. 21, in accordance with an embodiment.

Referring to FIG. 22, a plurality of memory cells included in the memory region 121 may form threshold voltage distributions DST1 and DST2 according to stored data. The horizontal axis Vth may mean a threshold voltage of a memory cell, and the vertical axis Cell # may mean the number of memory cells with respect to the threshold voltage. The threshold voltage distribution DST1 may indicate memory cells storing data 1. The threshold voltage distribution DST2 may indicate memory cells storing data 0.

Each memory cell may be turned on/off depending on its own threshold voltage when a predetermined read voltage is applied thereto through a corresponding word line. In detail, the memory cell may be turned on when a read voltage higher than its own threshold voltage is applied thereto, and may be turned off when a read voltage lower than its own threshold voltage is applied thereto.

In this case, the memory device 120 may apply a hard read voltage HV to the memory cell to sense current formed when the memory cell is turned on/off, and thus determine whether the threshold voltage of the memory cell is higher or lower than the hard read voltage HV. If the hard read voltage HV positioned between the threshold voltage distributions DST1 and DST2 is applied to the memory cell, the memory device 120 may determine whether the threshold voltage of the memory cell is higher or lower than the hard read voltage HV. In other words, the memory device 120 may determine, using the hard read voltage HV, a threshold voltage of the memory cell, and consequently may read data stored in the memory cell as the hard decision bit HD.

Here, at an initial stage, the threshold voltage distributions DST1 and DST2 are formed separately from each other, but may shift for a variety of reasons over time and partially overlap with each other, as illustrated in FIG. 22. Therefore, a memory cell having a threshold voltage positioned in an overlapping area between the threshold voltage distributions DST1 and DST2, or a memory cell having a threshold voltage close to the hard read voltage HV may not be accurately read using the hard read voltage HV, but generate an error bit.

Therefore, the memory device 120 may further read a soft decision bit set SD from a memory cell by applying soft read voltages V1 to V6 to the memory cell. When the soft read voltages V1 to V6 are applied to the memory cell, a soft decision bit set SD may be read according to the threshold voltage of the memory cell and the level of each of the soft read voltages V1 to V6. Furthermore, the soft decision bit set SD may include information about a difference between the threshold voltage of the memory cell and the hard read voltage HV.

For example, when a memory cell has a threshold voltage between the soft read voltages V3 and V4, if the soft read voltages V1 to V6 are applied to the corresponding memory cell, a soft decision bit set SD 123 may be read from the corresponding memory cell. In other words, based on the soft decision bit set SD 123, it can be understood that the corresponding memory cell has a threshold voltage between the soft read voltages V3 and V4 or in an overlapping area between the threshold voltage distributions DST1 and DST2, and the threshold voltage of the memory cell is close to the hard read voltage HV. Consequently, the hard decision bit HD read from the corresponding memory cell may be determined to have low reliability.

FIG. 22 further illustrates a channel reliability value table CNVTB with respect to values of the soft decision bit set SD. The channel reliability value table CNVTB may include the channel reliability value CNV that are respectively mapped to the values of the soft decision bit set SD. As described above, the magnitude of the channel reliability value CNV may indicate the reliability of the hard decision bit HD, and the sign thereof may indicate whether the hard decision bit HD is 1 or 0. In other words, as the magnitude of the channel reliability value CNV is reduced, the reliability of the hard decision bit HD may be reduced. Hence, the channel reliability value table CNVTB may be configured such that the soft decision bit set SD 123 is mapped to a channel reliability value CNV having a magnitude of 0.

Figure 23:
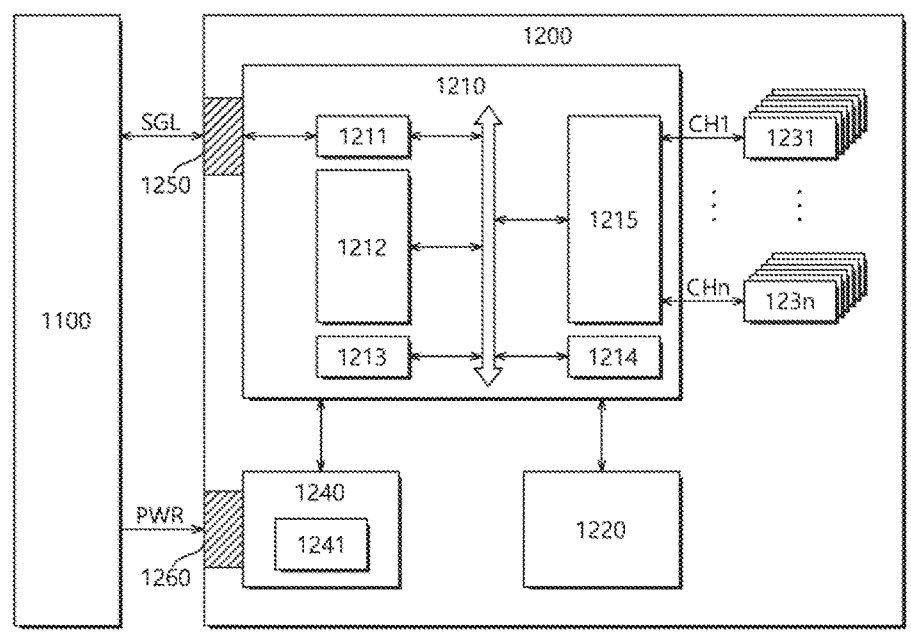
FIG. 23 is a diagram illustrating a data processing system including a solid state drive (SSD) in accordance with an embodiment.

FIG. 23 is a diagram illustrating a data processing system 1000 including a solid state drive (SSD) 1200 in accordance with an embodiment. Referring to FIG. 23, the data processing system 1000 may include a host device 1100 and the SSD 1200.

The SSD 1200 may include a controller 1210, a buffer memory device 1220, a plurality of nonvolatile memory devices 1231 to 123n, a power supply 1240, a signal connector 1250, and a power connector 1260.

The controller 1210 may control general operations of the SSD 1200. The controller 1210 may include a host interface unit 1211, a control unit 1212, a random access memory 1213, an error correction code (ECC) unit 1214, and a memory interface unit 1215.

The host interface unit 1211 may exchange a signal SGL with the host device 1100 through the signal connector 1250. The signal SGL may include a command, an address, data, and so forth. The host interface unit 1211 may interface the host device 1100 and the SSD 1200 according to the protocol of the host device 1100. For example, the host interface unit 1211 may communicate with the host device 1100 through any one of standard interface protocols such as secure digital, universal serial bus (USB), multimedia card (MMC), embedded MMC (eMMC), personal computer memory card international association (PCMCIA), parallel advanced technology attachment (PATA), serial advanced technology attachment (SATA), small computer system interface (SCSI), serial attached SCSI (SAS), peripheral component interconnection (PCI), PCI express (PCI-E) and universal flash storage (UFS).

The control unit 1212 may analyze and process the signal SGL received from the host device 1100. The control unit 1212 may control operations of internal function blocks according to a firmware or a software for driving the SSD 1200. The random access memory 1213 may be used as a working memory for driving such a firmware or software.

The ECC unit 1214 may generate the parity data of data to be transmitted to at least one of the nonvolatile memory devices 1231 to 123n. The generated parity data may be stored together with the data in the nonvolatile memory devices 1231 to 123n. The ECC unit 1214 may detect an error of the data read from at least one of the nonvolatile memory devices 1231 to 123n, based on the parity data. If a detected error is within a correctable range, the ECC unit 1214 may correct the detected error.

The ECC unit 1214 may include the error correction device 10 shown in FIG. 1 or the error correction device 20 shown in FIG. 14A.

The memory interface unit 1215 may provide control signals such as commands and addresses to at least one of the nonvolatile memory devices 1231 to 123n, according to control of the control unit 1212. Moreover, the memory interface unit 1215 may exchange data with at least one of the nonvolatile memory devices 1231 to 123n, according to control of the control unit 1212. For example, the memory interface unit 1215 may provide the data stored in the buffer memory device 1220, to at least one of the nonvolatile memory devices 1231 to 123n, or provide the data read from at least one of the nonvolatile memory devices 1231 to 123n, to the buffer memory device 1220.

The buffer memory device 1220 may temporarily store data to be stored in at least one of the nonvolatile memory devices 1231 to 123n. Further, the buffer memory device 1220 may temporarily store the data read from at least one of the nonvolatile memory devices 1231 to 123n. The data temporarily stored in the buffer memory device 1220 may be transmitted to the host device 1100 or at least one of the nonvolatile memory devices 1231 to 123*n* according to control of the controller 1210.

The nonvolatile memory devices 1231 to 123*n* may be used as storage media of the SSD 1200. The nonvolatile memory devices 1231 to 123*n* may be coupled with the controller 1210 through a plurality of channels CH1 to CHn, respectively. One or more nonvolatile memory devices may be coupled to one channel. The nonvolatile memory devices coupled to each channel may be coupled to the same signal bus and data bus.

The power supply 1240 may provide power PWR inputted through the power connector 1260, to the inside of the SSD 1200. The power supply 1240 may include an auxiliary power supply 1241. The auxiliary power supply 1241 may supply power to allow the SSD 1200 to be normally terminated when a sudden power-off occurs. The auxiliary power supply 1241 may include large capacity capacitors.

The signal connector 1250 may be configured by various types of connectors depending on an interface scheme between the host device 1100 and the SSD 1200.

The power connector 1260 may be configured by various types of connectors depending on a power supply scheme of the host device 1100.

Figure 24:
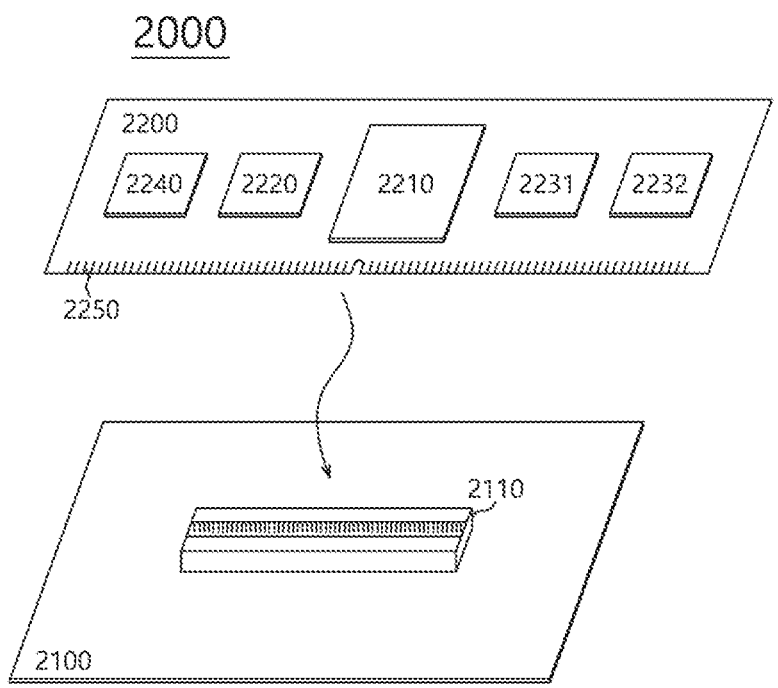
FIG. 24 is a diagram illustrating a data processing system including a memory system in accordance with an embodiment.

FIG. 24 is a diagram illustrating a data processing system 2000 including a memory system 2200 in accordance with an embodiment. Referring to FIG. 24, the data processing system 2000 may include a host device 2100 and the memory system 2200.

The host device 2100 may be configured in the form of a board such as a printed circuit board. Although not shown, the host device 2100 may include internal function blocks for performing the function of a host device.

The host device 2100 may include a connection terminal 2110 such as a socket, a slot or a connector. The memory system 2200 may be mounted to the connection terminal 2110.

The memory system 2200 may be configured in the form of a board such as a printed circuit board. The memory system 2200 may be referred to as a memory module or a memory card. The memory system 2200 may include a controller 2210, a buffer memory device 2220, nonvolatile memory devices 2231 and 2232, a power management integrated circuit (PMIC) 2240, and a connection terminal 2250.

The controller 2210 may control general operations of the memory system 2200. The controller 2210 may be configured in the same manner as the controller 1210 shown in FIG. 23.

The buffer memory device 2220 may temporarily store data to be stored in the nonvolatile memory devices 2231 and 2232. Further, the buffer memory device 2220 may temporarily store the data read from the nonvolatile memory devices 2231 and 2232. The data temporarily stored in the buffer memory device 2220 may be transmitted to the host device 2100 or the nonvolatile memory devices 2231 and 2232 according to control of the controller 2210.

The nonvolatile memory devices 2231 and 2232 may be used as storage media of the memory system 2200.

The PMIC 2240 may provide the power inputted through the connection terminal 2250, to the inside of the memory system 2200.

The PMIC 2240 may manage the power of the memory system 2200 according to control of the controller 2210.

The connection terminal 2250 may be coupled to the connection terminal 2110 of the host device 2100. Through the connection terminal 2250, signals such as commands, addresses, data and so forth and power may be transferred between the host device 2100 and the memory system 2200. The connection terminal 2250 may be configured into various types depending on an interface scheme between the host device 2100 and the memory system 2200. The connection terminal 2250 may be disposed on any one side of the memory system 2200.

Figure 25:
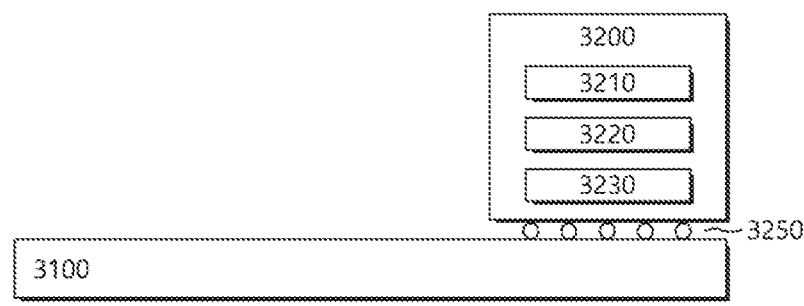
FIG. 25 is a diagram illustrating a data processing system including a memory system in accordance with an embodiment.

FIG. 25 is a diagram illustrating a data processing system 3000 including a memory system 3200 in accordance with an embodiment. Referring to FIG. 25, the data processing system 3000 may include a host device 3100 and the memory system 3200.

The host device 3100 may be configured in the form of a board such as a printed circuit board. Although not shown, the host device 3100 may include internal function blocks for performing the function of a host device.

The memory system 3200 may be configured in the form of a surface-mounting type package. The memory system 3200 may be mounted to the host device 3100 through solder balls 3250. The memory system 3200 may include a controller 3210, a buffer memory device 3220, and a nonvolatile memory device 3230.

The controller 3210 may control general operations of the memory system 3200. The controller 3210 may be configured in the same manner as the controller 1210 shown in FIG. 23.

The buffer memory device 3220 may temporarily store data to be stored in the nonvolatile memory device 3230. Further, the buffer memory device 3220 may temporarily store the data read from the nonvolatile memory device 3230. The data temporarily stored in the buffer memory device 3220 may be transmitted to the host device 3100 or the nonvolatile memory device 3230 according to control of the controller 3210.

The nonvolatile memory device 3230 may be used as the storage medium of the memory system 3200.

Figure 26:
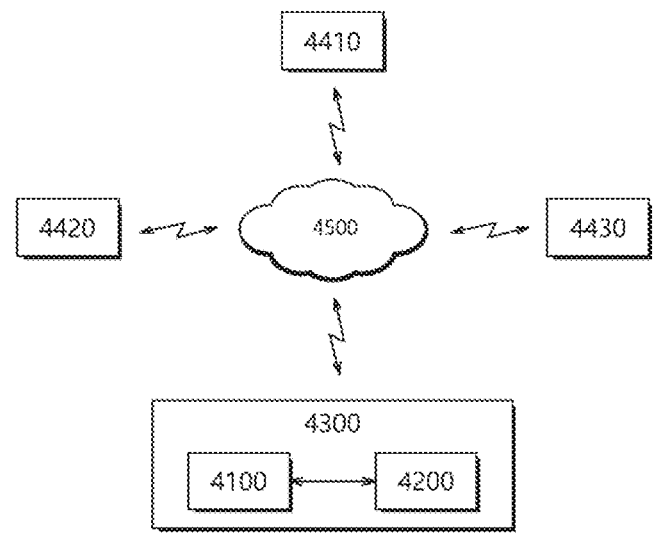
FIG. 26 is a diagram illustrating a network system including a memory system in accordance with an embodiment.

FIG. 26 is a diagram illustrating a network system 4000 including a memory system 4200 in accordance with an embodiment. Referring to FIG. 26, the network system 4000 may include a server system 4300 and a plurality of client systems 4410 to 4430 which are coupled through a network 4500.

The server system 4300 may service data in response to requests from the plurality of client systems 4410 to 4430. For example, the server system 4300 may store the data provided from the plurality of client systems 4410 to 4430. For another example, the server system 4300 may provide data to the plurality of client systems 4410 to 4430.

The server system 4300 may include a host device 4100 and the memory system 4200. The memory system 4200 may be configured by the memory system 100 shown in FIG. 21, the memory system 1200 shown in FIG. 23, the memory system 2200 shown in FIG. 24 or the memory system 3200 shown in FIG. 25.

Figure 27:
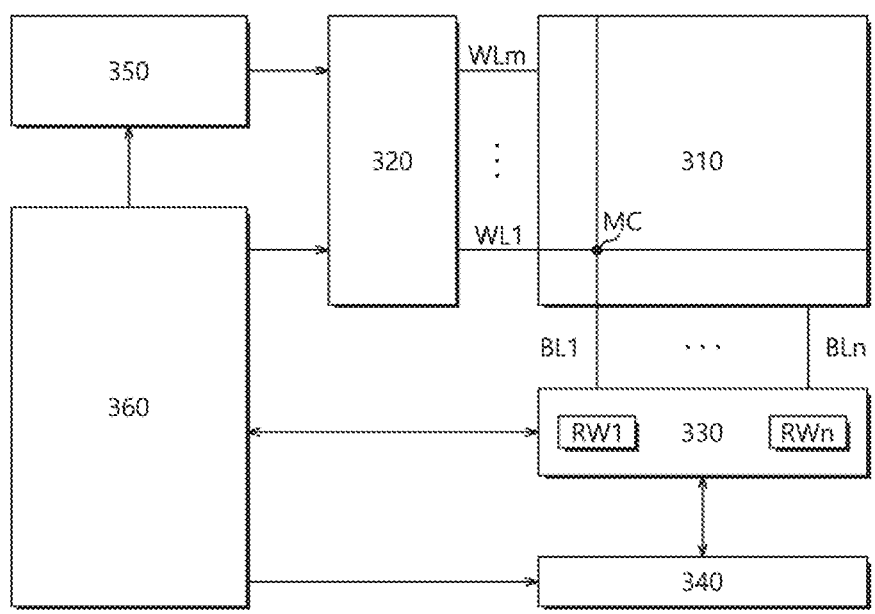
FIG. 27 is a block diagram illustrating a nonvolatile memory device included in a memory system in accordance with an embodiment.

FIG. 27 is a block diagram illustrating a nonvolatile memory device 300 included in a memory system in accordance with an embodiment. Referring to FIG. 27, the nonvolatile memory device 300 may include a memory cell array 310, a row decoder 320, a data read/write block 330, a column decoder 340, a voltage generator 350, and a control logic 360.

The memory cell array 310 may include memory cells MC which are arranged at areas where word lines WL1 to WLm and bit lines BL1 to BLn intersect with each other.

The row decoder 320 may be coupled with the memory cell array 310 through the word lines WL1 to WLm. The row decoder 320 may operate according to control of the control logic 360. The row decoder 320 may decode an address provided from an external device (not shown). The row decoder 320 may select and drive the word lines WL1 to WLm, based on a decoding result. For instance, the row decoder 320 may provide a word line voltage provided from the voltage generator 350, to the word lines WL1 to WLm.

The data read/write block 330 may be coupled with the memory cell array 310 through the bit lines BL1 to BLn. The data read/write block 330 may include read/write circuits RW1 to RWn respectively corresponding to the bit lines BL1 to BLn. The data read/write block 330 may operate according to control of the control logic 360. The data read/write block 330 may operate as a write driver or a sense amplifier according to an operation mode. For example, the data read/write block 330 may operate as a write driver which stores data provided from the external device, in the memory cell array 310 in a write operation. For another example, the data read/write block 330 may operate as a sense amplifier which reads out data from the memory cell array 310 in a read operation.

The column decoder 340 may operate according to control of the control logic 360. The column decoder 340 may decode an address provided from the external device. The column decoder 340 may couple the read/write circuits RW1 to RWn of the data read/write block 330 respectively corresponding to the bit lines BL1 to BLn with data input/output lines or data input/output buffers, based on a decoding result.

The voltage generator 350 may generate voltages to be used in internal operations of the nonvolatile memory device 300. The voltages generated by the voltage generator 350 may be applied to the memory cells of the memory cell array 310. For example, a program voltage generated in a program operation may be applied to a word line of memory cells for which the program operation is to be performed. For another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control general operations of the nonvolatile memory device 300, based on control signals provided from the external device. For example, the control logic 360 may control operations of the nonvolatile memory device 300 such as read, write and erase operations of the nonvolatile memory device 300.

While various embodiments have been described above, it will be understood to those skilled in the art that the embodiments described are by way of example only. Accordingly, the error correction device and the electronic device including the same described herein should not be limited based on the described embodiments. Rather, the error correction device and the electronic device including the same described herein should only be limited in light of the claims that follow when taken in conjunction with the above description and accompanying drawings.

What is claimed is:

1. An error correction device comprising:
a plurality of variable node units each configured to:
receive a hard decision bit and a channel reliability value having a first bit-precision; and
perform an iteration of a decoding operation on the hard decision bit based on the channel reliability value;
a plurality of check node units each configured to:
receive one or more reference reliability values having a second bit-precision from one or more variable node units coupled thereto among the plurality of variable node units during the iteration; and
transmit, based on the one or more reference reliability values, one or more check reliability values having the second bit-precision to the one or more variable node units coupled thereto,
wherein, during the iteration, each of the plurality of variable node units further:
receives one or more first check reliability values from one or more check node units coupled thereto among the plurality of check node units; and
updates the hard decision bit with reference to the channel reliability value and the one or more first check reliability values by upsizing the first bit-precision of the channel reliability value and the second bit-precision of the one or more first check reliability values.

2. The error correction device according to claim 1, further comprising a memory configured to store at least one upsizing table including a plurality of output values respectively mapped to a plurality of input values,
wherein, during the iteration, each of the plurality of variable node units further determines an output value mapped to an input value of the channel reliability value to be an upsized channel reliability value and determines output values mapped to input values of the one or more first check reliability values to be upsized check reliability values, with reference to the at least one upsizing table, and
wherein, during the iteration, each of the plurality of variable node units updates the hard decision bit by calculating the upsized channel reliability value and the upsized check reliability values.

3. The error correction device according to claim 2, wherein the plurality of output values have an upsized bit-precision compared to the first bit-precision and the second bit-precision.

4. The error correction device according to claim 2, wherein the plurality of output values are constant multiples of log-likelihood ratios (LLRs) of the hard decision bit.

5. The error correction device according to claim 2, wherein, during the iteration, each of the plurality of variable node units:
determines the upsized channel reliability value with reference to a first upsizing table of the at least one upsizing table; and
determines the upsized check reliability values with reference to a second upsizing table of the at least one upsizing table.

6. The error correction device according to claim 2, wherein, during the iteration, each of the plurality of variable node units:
determines the upsized channel reliability value with reference to a first upsizing table of the at least one upsizing table;
determines at least one upsized check reliability value of the upsized check reliability values with reference to a second upsizing table of the at least one upsizing table; and
determines another upsized check reliability value of the upsized check reliability values with reference to a third upsizing table of the at least one upsizing table.

7. The error correction device according to claim 2, wherein, during the iteration, each of the plurality of variable node units further determines a final reliability value by summing the upsized channel reliability value and the upsized check reliability values, and wherein, during the iteration, each of the plurality of variable node units updates the hard decision bit based on a sign of the final reliability value.

8. The error correction device according to claim 7, wherein, during a subsequent iteration of the iteration, each of the plurality of variable node units further:
determines, based on the upsized channel reliability value and the upsized check reliability values, a sum of upsized extrinsic information of a first check node unit of the one or more check node units coupled thereto, to be an upsized reference reliability value;
determines a reference reliability value by downsizing bit-precision of the upsized reference reliability value; and
transmits the reference reliability value to the first check node unit.

9. The error correction device according to claim 8, wherein, during the subsequent iteration, each of the plurality of variable node units determines the sum of the upsized extrinsic information of the first check node unit by summing the upsized channel reliability value and the upsized check reliability values other than an upsized check reliability value of a first check reliability value transmitted from the first check node unit.

10. The error correction device according to claim 8, wherein, during the subsequent iteration, each of the plurality of variable node units determines the sum of the upsized extrinsic information by subtracting, from the final reliability value, an upsized check reliability value of a first check reliability value transmitted from the first check node unit.

11. The error correction device according to claim 8, further comprising a syndrome check unit configured to:
receive, from the plurality of variable node units, respective hard decision bits updated during the iteration; and
perform a syndrome check operation on the updated hard decision bits to determine whether the decoding operation has succeeded,
wherein each of the variable node units performs the subsequent iteration when receiving, from the syndrome check unit, a report that the decoding operation fails.

12. The error correction device according to claim 8, wherein the memory further stores at least one downsizing table including a plurality of output values respectively mapped to a plurality of ranges of an input value, and
wherein, during the subsequent iteration, each of the plurality of variable node units further determines, with reference to the downsizing table, an output value mapped to a range, in which the upsized reference reliability value falls among the plurality of ranges, to be the reference reliability value.

13. The error correction device according to claim 12, wherein the plurality of ranges included in the downsizing table respectively include output values included in the upsizing table.

14. The error correction device according to claim 12, wherein the output values included in the downsizing table have the second bit-precision.

15. The error correction device according to claim 12, wherein, during the subsequent iteration, each of the plurality of variable node units determines the reference reliability value to be transmitted to the first check node unit with reference to a first downsizing table of the at least one downsizing table, and
wherein, during the subsequent iteration, each of the plurality of variable node units further determines a reference reliability value to be transmitted to a second check node unit of the check node units coupled thereto with reference to a second downsizing table of the at least one downsizing table.

16. The error correction device according to claim 12, wherein each of the plurality of variable node units refers to a first upsizing table of the at least one upsizing table during the iteration, and refers to a second upsizing table of the at least one upsizing table during the subsequent iteration.

17. The error correction device according to claim 12, wherein each of the plurality of variable node units refers to a first downsizing table of the at least one downsizing table during the iteration, and refers to a second downsizing table of the at least one downsizing table during the subsequent iteration.

18. The error correction device according to claim 12, wherein, during the iteration, a first variable node unit and a second variable node unit of the plurality of variable node units respectively refer to different upsizing tables and/or different downsizing tables that are stored in the memory.

19. The error correction device according to claim 2, wherein, when the first bit-precision is lower than the second bit-precision, during the iteration, each of the plurality of variable node units upsizes, before the determining of the output value, the first bit-precision of the channel reliability value so that the channel reliability value has the second bit-precision.

20. The error correction device according to claim 1, further comprising:
a memory configured to store at least one channel reliability value table including a plurality of output values respectively mapped to a plurality of input values, the plurality of output values having the first bit-precision; and
a channel reliability value determination unit configured to:
receive a soft decision bit set including reliability information of the hard decision bit and formed of a plurality of soft decision bits; and
determine an output value mapped to an input value of the soft decision bit set, to be the channel reliability value with reference to the channel reliability value table.

* * * * *